United States Patent [19]
Kanazawa et al.

[11] Patent Number: 5,920,089
[45] Date of Patent: *Jul. 6, 1999

[54] MULTI-POWER SUPPLY INTEGRATED CIRCUIT AND SYSTEM EMPLOYING THE SAME

[75] Inventors: Masahiro Kanazawa; Kimiyoshi Usami, both of Kanagawa-ken, Japan

[73] Assignee: Kabushiki Kaisha Toshiba, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/882,082

[22] Filed: Jun. 25, 1997

[30] Foreign Application Priority Data

Jun. 28, 1996 [JP] Japan ................................. 8-170009
Jun. 19, 1997 [JP] Japan ................................. 9-162634

[51] Int. Cl.$^6$ ............................................ H01L 29/76
[52] U.S. Cl. ..................... 257/202; 257/371; 257/372; 257/204; 257/206; 257/207; 257/369; 327/110; 327/112; 327/210; 327/213; 327/272; 327/391
[58] Field of Search ................................. 257/202, 203, 257/204, 205, 206, 207, 236, 373, 341, 342, 343, 369, 371, 372; 326/45, 50, 58, 84, 85, 103, 121, 104, 122; 327/97, 107, 210, 213, 272, 391, 112, 110

[56] References Cited

U.S. PATENT DOCUMENTS

| 5,239,197 | 8/1993 | Yamamoto | 257/369 |
|---|---|---|---|
| 5,332,916 | 7/1994 | Hirai | 257/369 |
| 5,399,917 | 3/1995 | Allen et al. | 257/371 |
| 5,446,303 | 8/1995 | Quill et al. | 257/357 |
| 5,473,183 | 12/1995 | Yonemoto | 257/371 |
| 5,506,437 | 4/1996 | May et al. | 257/369 |
| 5,581,103 | 12/1996 | Mizukami | 257/369 |

*Primary Examiner*—Tom Thomas
*Assistant Examiner*—Fetsum Abraham
*Attorney, Agent, or Firm*—Foley & Lardner

[57] ABSTRACT

There is disclosed a multi-power supply integrated circuit including a first pMOS transistor which is formed in a first n-well and operated at a first supply voltage and a second pMOS transistor which is formed in a second n-well and operated at a second supply voltage being lower than the first supply voltage, wherein the first n-well and the second n-well are placed adjacently to put a boundary line therebetween and also the first supply voltage is supplied to both the first and second n-wells. Because a space between the first and second n-wells is made small, a gate array LSI with a reduced chip area is provided. A common n-well may be formed in place of the first and second n-wells.

31 Claims, 37 Drawing Sheets

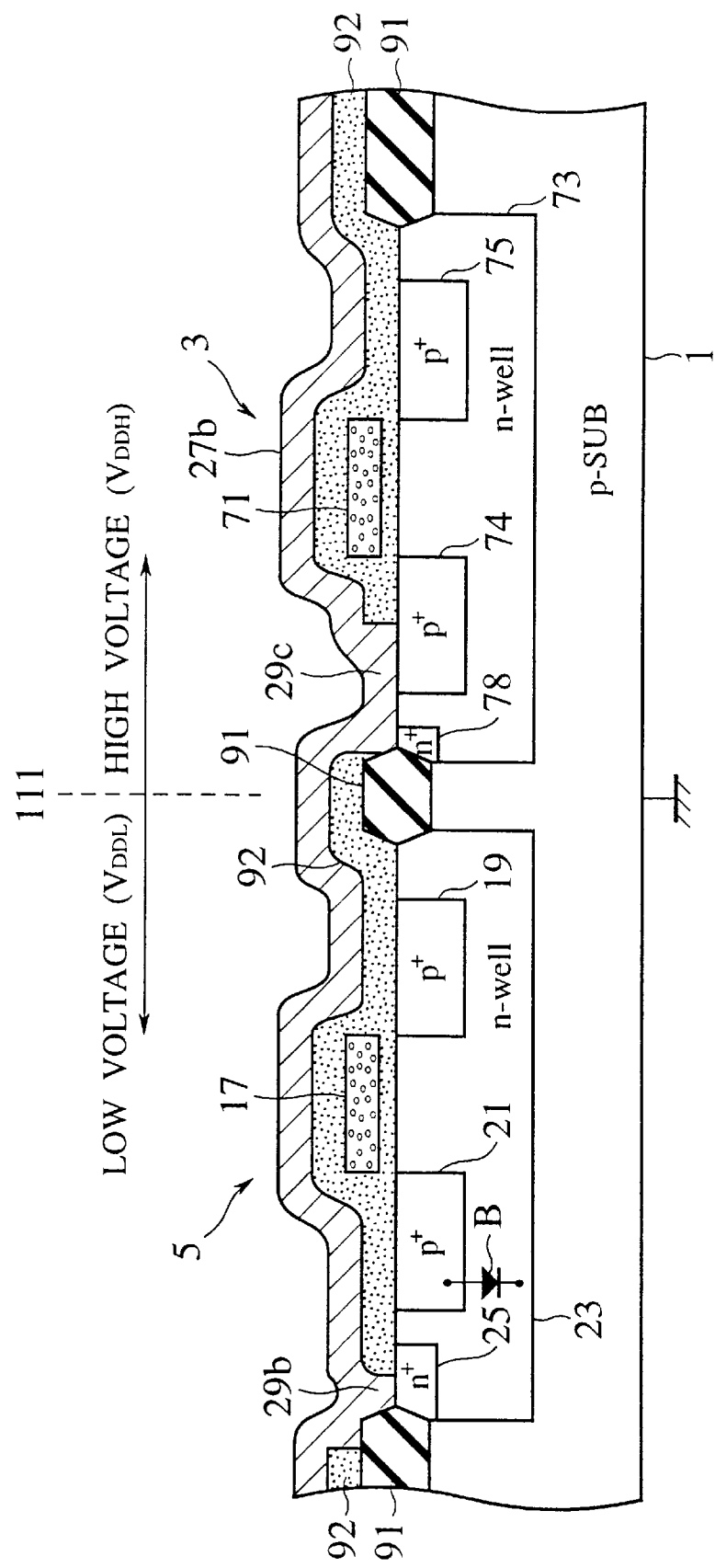

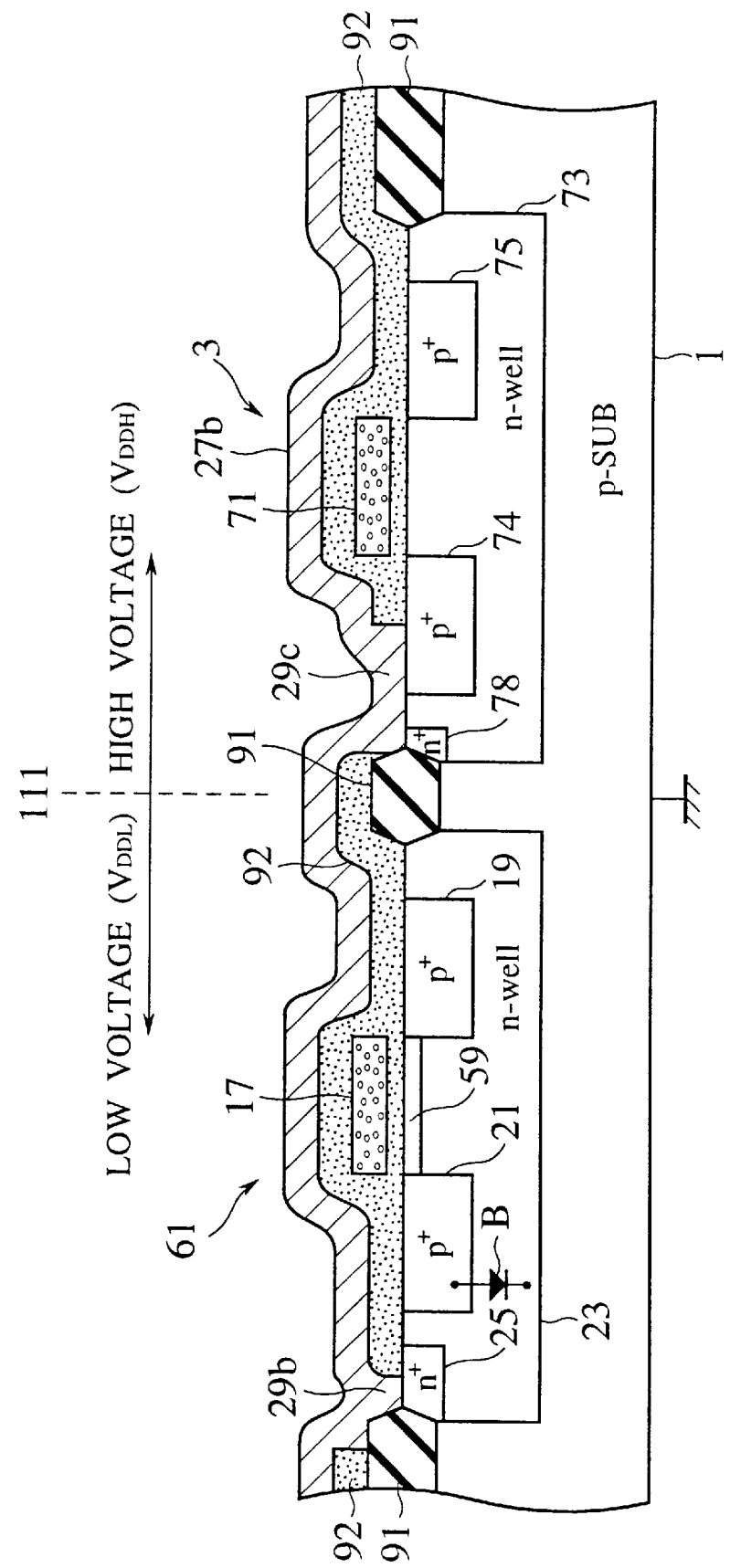

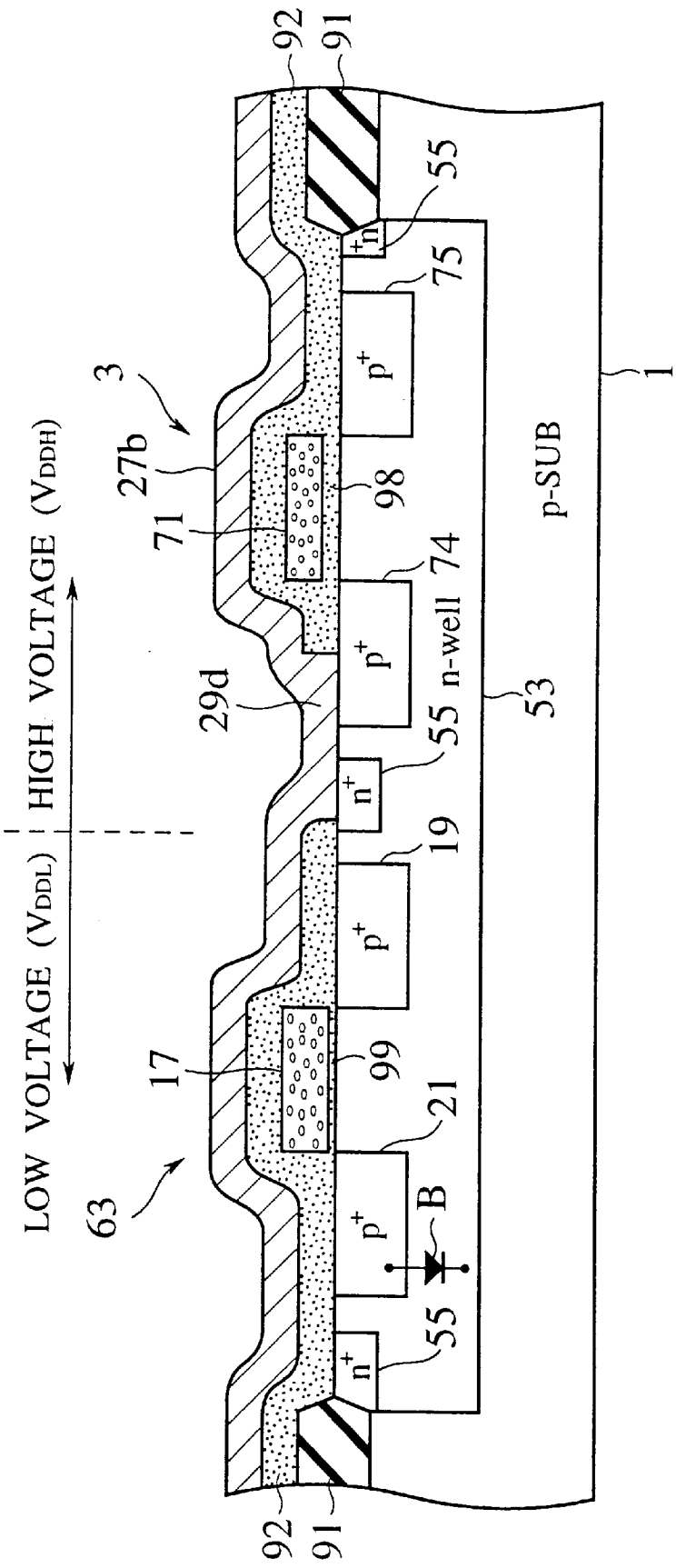

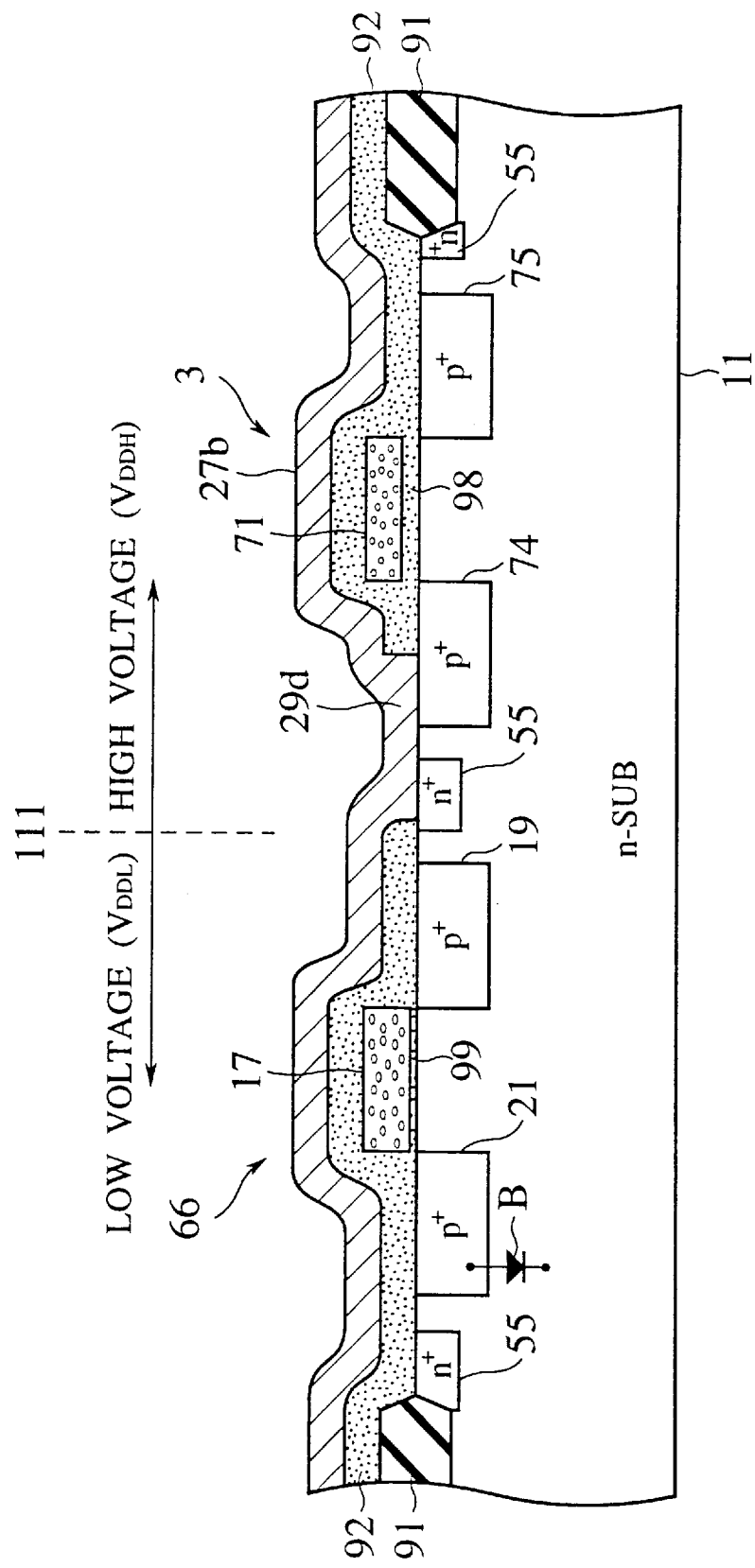

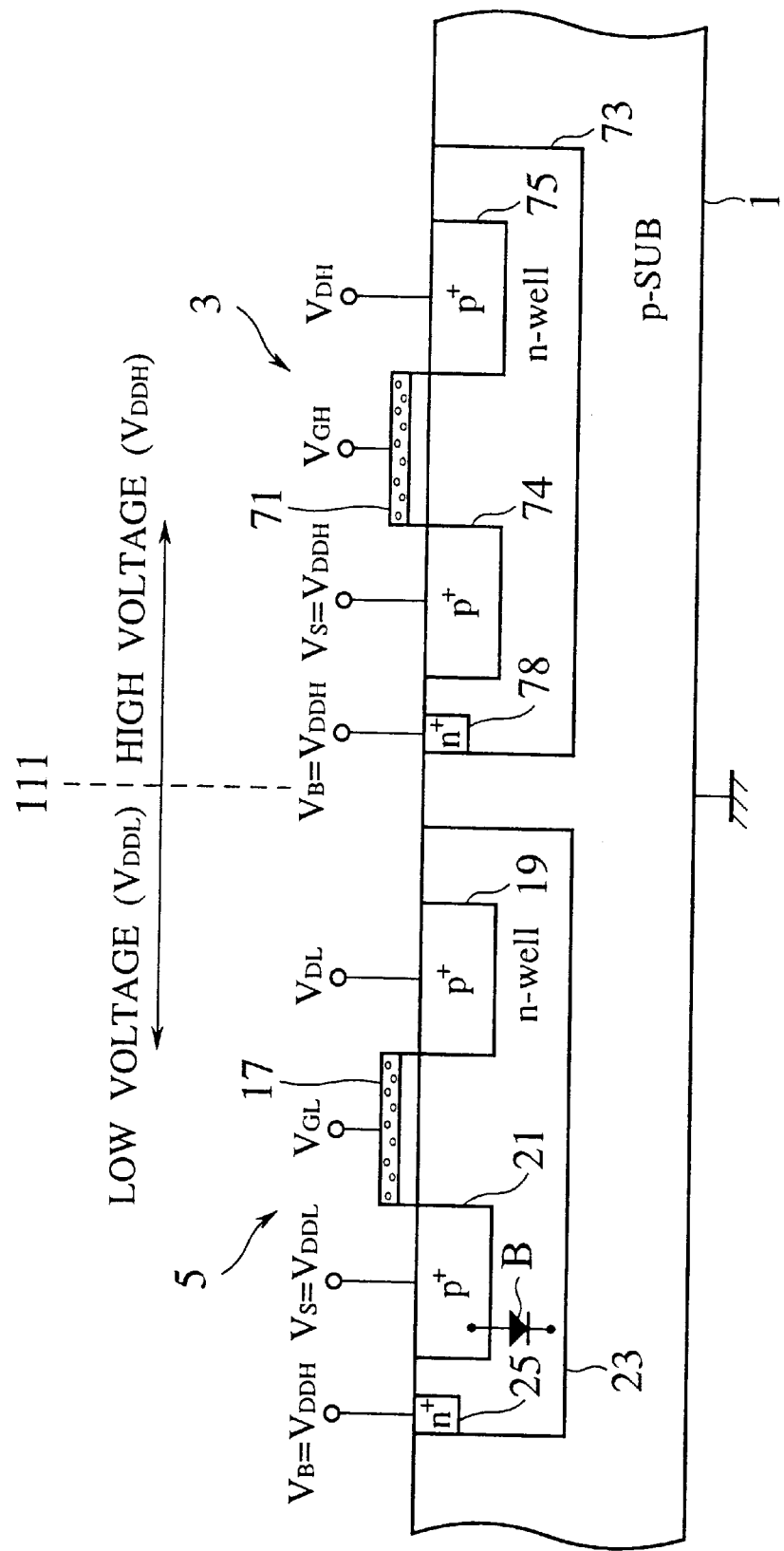

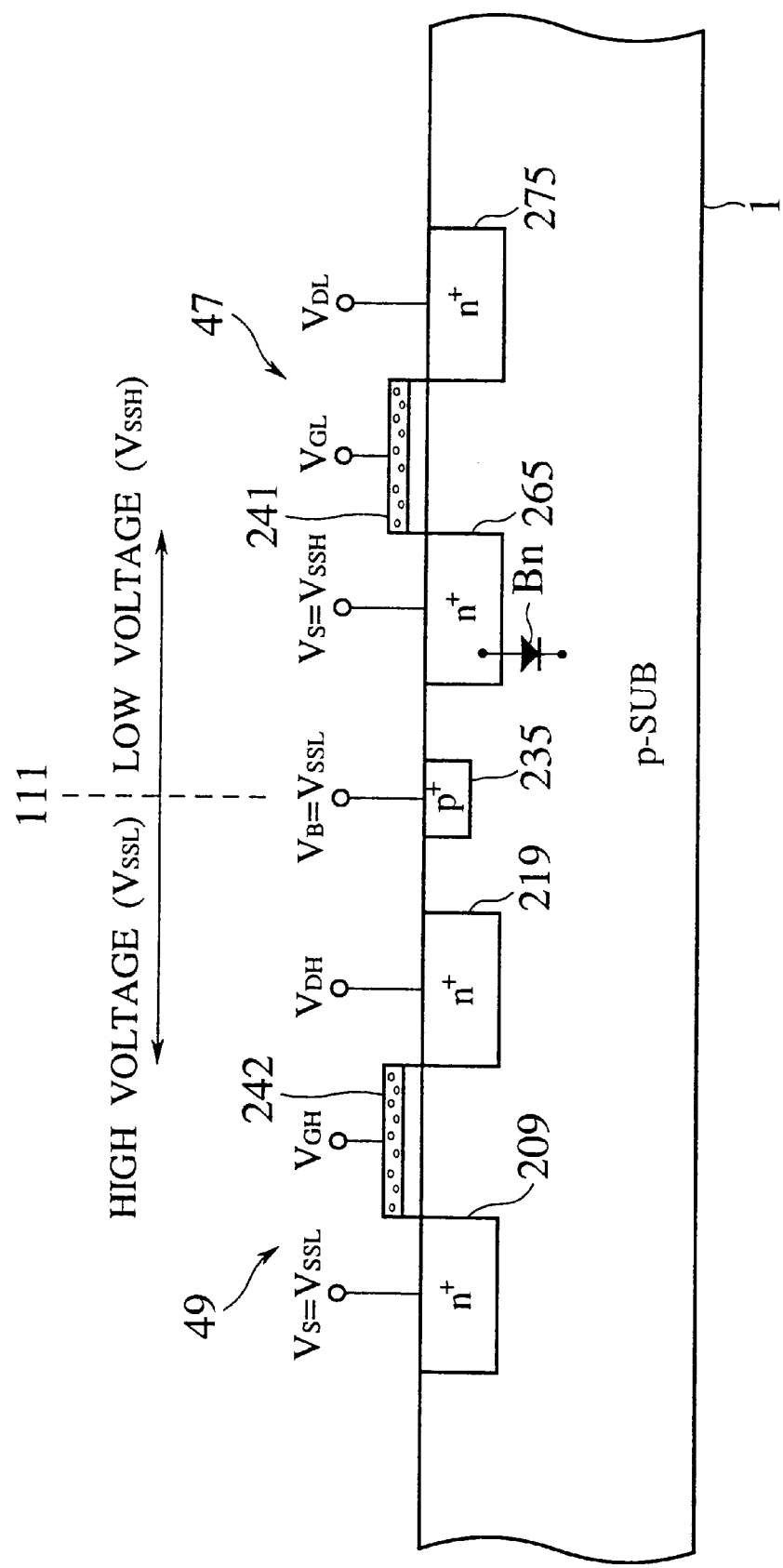

E/E CONFIGURATION

E/D CONFIGURATION

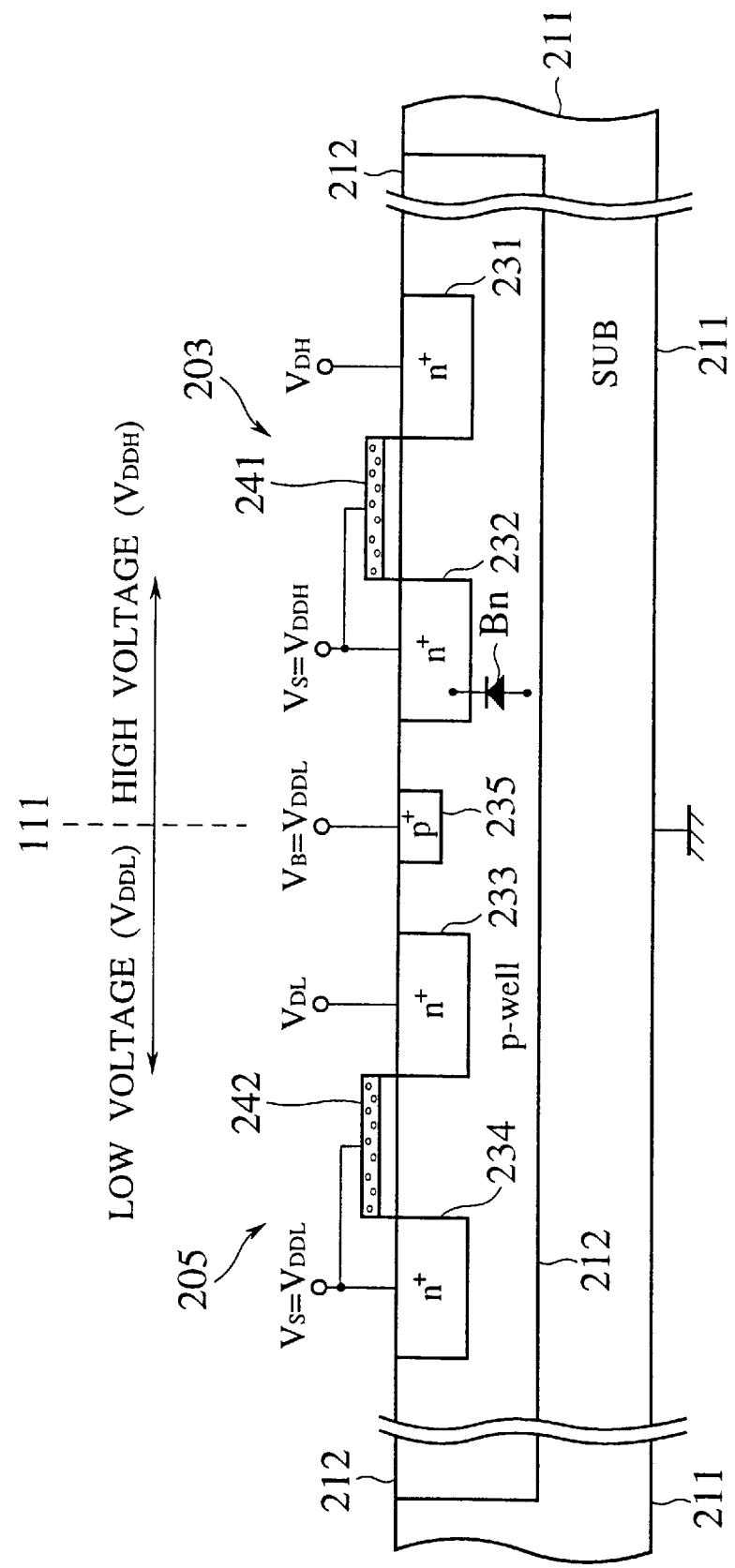

MULTI-POWER SUPPLY INTEGRATED CIRCUIT AND SYSTEM EMPLOYING THE SAME

BACKGROUND OF THE INVENTION

1. Field of the Invention

The present invention relates to a multi-power supply integrated circuit employing multiple power supply voltages and, more particularly, a multi-power supply integrated circuit capable of reducing a chip area without reduction in reliability and a circuit system employing such multi-power supply integrated circuit.

2. Description of the Background Art

It is more difficult to design all the semiconductor integrated circuit manually as the semiconductor integrated circuit becomes larger in scale. Hence, a semicustom design methodology which is an automated design by using a computer has been commonly employed. This semicustom design methodology means such an approach that a plurality of standard basic circuits (logic cells) are prepared in advance and then a desired circuit is developed by carrying out an automatic design of these logic cells with the use of the computer aided design. As typical examples of such semicustom design methodology, there are a gate array design approach and a standard array design approach. For the purposes of example, in the gate array approach shown in FIG. 1, basic cells 103 used to constitute basic logic circuits such as NAND, NOR, NOT are aligned regularly in rows on a semiconductor chip 101, and wiring passages (wiring channels) 107 used to connect the basic cells 103 to each other are provided between respective cell arrays 105. Therefore, a target circuit can be developed in a short time only by installing wirings between the desired basic cells 103 via the wiring channels 107. For example, as shown in FIG. 2A, the basic cells 103 are composed of source/drain regions 74, 75, 76, 77 and polysilicon regions 71 to constitute a plurality of PMOS transistors (abbreviated to "pMOSs" hereinafter) and a plurality of nMOS transistors (abbreviated to "nMOSs" hereinafter). Then, as shown in FIG. 2B, basic logic circuits can be formed by installing the wirings to connect these transistors.

In FIG. 2A, two neighboring basic cells 103 are depicted as a basic cell 103a and a basic cell 103b. The basic cells 103a, 103b are composed of $p^+$ source/drain diffusion regions 74, 75, $n^+$ source/drain diffusion regions 76, 77, and gate polysilicon regions 71 respectively. In other words, in FIG. 2A, two basic cells 103a, 103b each of which is composed of two nMOSs 1a, 1b and two pMOSs 2a, 2b are placed so as to put substrate contact regions 78, 79 therebetween respectively, thus constituting one functional block. In a layout according to the gate array approach, as shown in FIG. 2A, a wiring channel lattice serving as a criterion in designing wiring layers is provided on a surface including the basic cells 103a, 103b. Along the wiring channel lattice consisting of twelve lines X0 to X11 depicted in the X direction and seven lines Y0 to Y6 depicted in the Y direction, the overall layout of metal wirings, contact holes and via holes etc. would be designed. FIG. 2B shows layout patterns of the metal wirings if a four-input NAND circuit shown in FIG. 2C is constituted in the layout of the gate basic cell shown in FIG. 2A, to which the wiring channel lattice is provided. By disposing vertical metal wirings (i.e., VDD power supply wiring 85a and VSS power supply wiring 85b) and lateral metal wirings (interconnections 86) to connect the transistors 1a, 1b, 2a, 2b mutually, the four-input (A, B, C, D) NAND gate (Z output) can be completed.

A low power consumption requirement is made much account more and more with the progress of an integration density of the semiconductor integrated circuit. Rapidly increasing demand for portable electronic products has prompted a great deal of interest in integrated circuits with very low power consumption. Lower power consumption can be achieved in principle if amplitudes of the supply voltages are made smaller. And the most common approach for reducing power consumption in integrated circuits is to lower the supply voltage. However, a speed-performance of the integrated circuit becomes degraded if the supply voltages are uniformly decreased. Since various logic circuits and gates are included in the semiconductor integrated circuit, basic cells which need a high speed operation and basic cells which do not need relatively the high speed operation are often formed mixedly on a semiconductor chip. Therefore, in the event that the cells and the gates for which the high speed operation is required are driven by the high supply voltage ($V_{DDH}$) ensuring the peak performance of transistors and circuits while the cells and the gates for which the high speed operation is not required so much are driven by the low supply voltage ($V_{DDL}$), low power consumption of the semiconductor integrated circuit can be achieved while keeping the high speed operation as an overall performance.

According to such design concept, the inventors of the present invention have examined the multi-power supply integrated circuit. However, it has been found by the inventors of the present invention that, if the multi-power supply integrated circuit employing multiple supply voltages (e.g., two supply voltages consisting of the high supply voltage ($V_{DDH}$) and the low supply voltage ($V_{DDL}$)) is designed, such a disadvantage is caused that a chip area is increased rather than the case where a single supply voltage is employed, as will be explained later.

FIG. 3 is a sectional view showing a part of a gate array having integrated circuits operating with two supply voltages, which has been examined as a preliminary stage of the present invention. As shown in FIG. 3, in this multi-power supply integrated circuit, a PMOS 3 which constitutes a high potential basic cell ($V_{DDH}$ cell) operated at the high supply voltage ($V_{DDH}$) and a pMOS 115 which constitutes a low potential basic cell ($V_{DDL}$ cell) operated at the low supply voltage ($V_{DDL}$) are placed adjacently on a p substrate 1 to sandwich a boundary line 111 of the high potential basic cell and the low potential basic cell therebetween. The PMOS 3 comprises a gate electrode 71 serving as a gate, a $p^+$ diffusion layer 75 formed in an n-well 73 and serving as a drain, a $p^+$ diffusion layer 74 formed in the n-well 73 and serving as a source, and an $n^+$ diffusion layer 78 for supplying the high supply voltage ($V_{DDH}$) to the n-well 73. Similarly, the pMOS 115 comprises a gate electrode 17 serving as a gate, a $p^+$ diffusion layer 19 formed in an n-well 133 and serving as a drain, a $p^+$ diffusion layer 131 formed in the n-well 133 and serving as a source, and an $n^+$ diffusion layer 135 for supplying the low supply voltage ($V_{DDL}$) to the n-well 133. Usually, in the CMOS circuit, the source region and "the substrate" (or the p-well if the nMOS is formed in the p-well) of the nMOS is connected to ground (GND), and the source region and "the substrate" (or the n-well if the pMOS is formed in the n-well) of the PMOS are connected to the supply voltage (VDD). Therefore, the PMOS 3 operated at the high supply voltage and the pMOS 115 operated at the low supply voltage must be formed in different n-wells respectively. For this reason, as described above, the pMOS 3 and the pMOS 115 are formed separately in the n-wells 73, 133, and then the high supply voltage ($V_{DDH}$) is applied to the n-well 73 in which the pMOS 3 is formed while the low supply voltage ($V_{DDL}$) is applied to the n-well 133 in which the pMOS 115 is formed. Consequently a high voltage of ($V_{DDH}-V_{DDL}$) is applied to an region located between the n-well 73 and the n-well 133, and therefore carrier injection from the n-well 73 to the n-well 133 is caused through an area indicated by A in FIG. 3 if a resistance between two n-wells is small. This carrier injection causes reduction in reliability of the integrated circuit.

In order to suppress such carrier injection, as shown in FIG. 4, an approach has been thought out wherein the basic cell 103H composed of the pMOS 3 operated at the high supply voltage and the basic cell 103L composed of the pMOS 115 operated at the low supply voltage are placed to be separated at a certain distance so as to obtain high resistance between two n-wells. But, as shown in FIG. 4, this arrangement is substantially equivalent to formation of basic cells 103H', 103L' which correspond to the basic cells 103H, 103L expanded in the lateral direction (i.e., direction indicated by an arrow in FIG. 4). This causes an increase of the chip area of the semiconductor chip 101. In order to avoid such increase of the chip area as illustrated in FIG. 4, another approach may be thought out wherein a common n-well for high supply voltage and another common n-well for low supply voltage are provided so that two common n-wells are separated by a predetermined distance each other. And a cell array consisting of a plurality of high potential basic cells and another cell array consisting of a plurality of low potential basic cells are arranged in respective common n-wells. In this case, lengths of the wiring provided between individual basic cells which are formed in one common n-well and individual basic cells which are formed in another common n-well are made longer. A wiring space is increased correspondingly if the number of wiring is increased. Also, longer wirings cause the problem of signal delay due to the wirings.

As has been mentioned earlier, it has been derived from the inventors' examination that, if the multi-power supply integrated circuit is designed according to the above-mentioned semicustom design methodology, the basic cells which are operated at different supply voltages have to be arranged separately at a distance to assure reliability in operation of the integrated circuit, so that the increase of the chip area is inevitably brought about.

SUMMARY OF THE INVENTION

The present invention has been made in view of the above circumstances, and it is an object of the present invention to provide a multi-power supply integrated circuit capable of reducing a chip area with low power consumption without reduction in reliability if the circuit is designed automatically according to a semicustom design methodology.

It is another object of the present invention to provide a semicustom multi-power supply integrated circuit capable of making an improvement in an integration density easily and achieving a high speed operation as an overall performance.

It is still another object of the present invention to provide a circuit system including a multi-power supply integrated circuit capable of being designed with a high integration density and with high reliability, and capable of operating at a high speed and with low power consumption.

It is yet still another object of the present invention to provide a circuit system capable of reducing a chip area of a multi-power supply integrated circuit or improving an integration density thereof easily, and making a system design easy.

In order to attain the above objects, according to a first aspect of a semiconductor integrated circuit of the present invention, there is provided a multi-power supply integrated circuit comprising a first n-well to which a first supply voltage is applied; a second n-well which is placed at a closest location to the first n-well and to which the first supply voltage is applied; a first PMOS transistor which is formed in the first n-well and has its p$^+$ source region to which the first supply voltage is applied; and a second pMOS transistor which is formed in the second n-well and has its p$^+$ source region to which a second supply voltage being lower than the first supply voltage is applied. More particularly, there is provided the multi-power supply integrated circuit comprising a high potential basic cell having the first pMOS transistor operated at the first supply voltage (high supply voltage: $V_{DDH}$) and a low potential basic cell having the second pMOS transistor operated at the second supply voltage (low supply voltage: $V_{DDL}$) being lower than the high supply voltage in the form of cell arrays, or the like in a semicustom LSI, wherein the high supply voltage is supplied to both the first n-well, in which the first pMOS transistor is formed, and the second n-well, which is placed at a closest location to the first n-well and in which the second pMOS transistor is formed, both the first and second n-wells being placed to put a boundary line between the high potential basic cell and the low potential basic cell.

As has been well known in the art, since the source region and the drain region of the MOS transistor are formed symmetrically, generally they can be replaced with each other. Therefore, it would be understood that one main electrode of the pMOS transistor is meant by the wording "p$^+$ source region" referred to herein. In other words, one of two main electrodes of the pMOS transistor to which the supply voltage is applied is called "p$^+$ source region" hereinafter.

According to the above configuration, no potential difference appears between the first and second n-wells since the first supply voltage (high supply voltage) is also supplied to the second n-well. Hence, carrier injection between the first and second n-wells can be suppressed to thus improve reliability of the integrated circuit without requiring high resistance between adjacent n-wells. Since respective n-wells can be placed in close vicinity to each other without regard to such carrier injection, cell arrays constituting a gate array, etc. can be scaled in the lateral direction to thus reduce the chip area. Further, the first pMOS transistor and the second pMOS transistor aligned on the same cell array (cell row) may be formed in the same n-well to which the high supply voltage is supplied. If the same n-well is employed, the cell arrays can be downsized much more in the lateral direction to thus reduce the chip area much more. Still further, the first pMOS transistor and the second pMOS transistor may be formed directly on an n substrate.

According to the above-mentioned configuration, a certain potential difference appears between the p$^+$ source region of the second PMOS transistor and the second n-well to thus generate "a substrate bias effect". In this case, if a threshold voltage of the second pMOS transistor is determined to take into account the substrate bias effect which is generated when the second pMOS transistor is operated, an increase in an absolute value of the threshold voltage due to the substrate bias effect can be canceled. Hence, signal delay in the second pMOS transistor can be prevented and therefore an operation speed of the circuit can be improved. According to the first aspect of the present invention, further a third PMOS transistor having its p$^+$ source region to which a third supply voltage being lower than the first supply voltage is applied may be formed in a third n-well to which the first supply voltage is applied. In addition, the first, second, and third pMOS transistors may be formed in the same n-well or in the n substrate. In this case, since the cell arrays can be contracted in the lateral direction, the chip area can be reduced or an integration density can be improved. The third supply voltage may be set lower than the second power supply voltage.

According to a second aspect of the present invention, there is provided a circuit system comprising at least the multi-power supply integrated circuit set forth according to the first aspect, and a supply voltage control circuit for controlling an application sequence of supply voltages to be supplied to the multi-power supply integrated circuit. More particularly, the multi-power supply integrated circuit for use in the second aspect of the present invention comprises at least a first n-well to which a first supply voltage is applied; a second n-well which is placed at a closest location to the first n-well and to which the first supply voltage is applied; a first pMOS transistor which is formed in the first n-well and has its $p^+$ source region to which the first supply voltage is applied; and a second PMOS transistor which is formed in the second n-well and has its $p^+$ source region to which a second supply voltage being lower than the first supply voltage is applied. The supply voltage control circuit used in the second aspect of the present invention is connected to the multi-power supply integrated circuit, and has a sequence controlling function to apply the second supply voltage after application of the first supply voltage.

According to the second aspect of the present invention, since a hardware is so constructed that the low supply voltage is applied after the high supply voltage is applied to the second PMOS transistor, there is no necessity of specifying an application sequence of two supply voltages once again upon constructing a system employing the multi-power supply integrated circuit. Hence, system design can be facilitated. It is of course that a semiconductor integrated circuit to which the first supply voltage (high supply voltage: $V_{DDH}$), the second supply voltage (middle supply voltage: $V_{DDM}$), and the third supply voltage (low supply voltage: $V_{DDL}$) are applied may be monolithically integrated in a single semiconductor chip as the multi-power supply integrated circuit and the supply voltage control circuit may be designed to have a function to control an application sequence of the first, the second, and the third supply voltages.

Further, the application of the present invention is not limited to PMOS, but also applicable to nMOS. Namely, a first basic cell composed of a first nMOS transistor disposed in a first p semiconductor region and a second basic cell composed of a second nMOS transistor disposed in a second p semiconductor region may be placed adjacently. And then a low supply voltage (a first supply voltage) may be supplied to both the first and the second p semiconductor regions. An $n^+$ source region in the second nMOS is supplied with the second supply voltage (high supply voltage). An $n^+$ source region in the first nMOS is supplied with the first supply voltage (low supply voltage). The first and second basic cells may be arranged in a common p-well in place of two independent p-wells (p semiconductor regions), or else the first and second potential basic cells may be arranged in the p substrate. Then, the cell arrays comprising nMOS circuits can be scaled down in the lateral direction to reduce the chip size. The first and second basic cells correspond to the high and low potential basic cells for nMOSs in CMOS configuration respectively. If these nMOSs are employed as load transistors in nMOS logic, the first and second basic cells correspond to the low and high potential basic cells, respectively.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

BRIEF DESCRIPTION OF THE DRAWINGS

FIG. 5C is a sectional view, taken along a I—I direction in FIG. 5B, showing the p transistor side of the CMOS multi-power supply integrated circuit in FIG. 5B;

FIG. 7A is a sectional view showing a multi-power supply integrated circuit according to a third embodiment of the present invention;

FIG. 7C is a sectional view showing a multi-power supply in grated circuit according to another modification of the third embodiment of the present invention;

FIG. 7F is a sectional view showing a multi-power supply integrated circuit according to a further modification of the third embodiment of the present invention;

FIG. 8 is a sectional view showing a part of a semiconductor chip for use in a multi-power supply integrated circuit system according to a fourth embodiment of the present invention;

FIG. 12C is a sectional view, taken along II—II direction in FIG. 12B, showing the nMOS side of the CMOS multi-power y integrated circuit.

FIG. 15 is a sectional view showing only an nMOS transistor arranged on the load side in FIG. 14A.

DETAILED DESCRIPTION OF THE EMBODIMENTS

Figure 1:
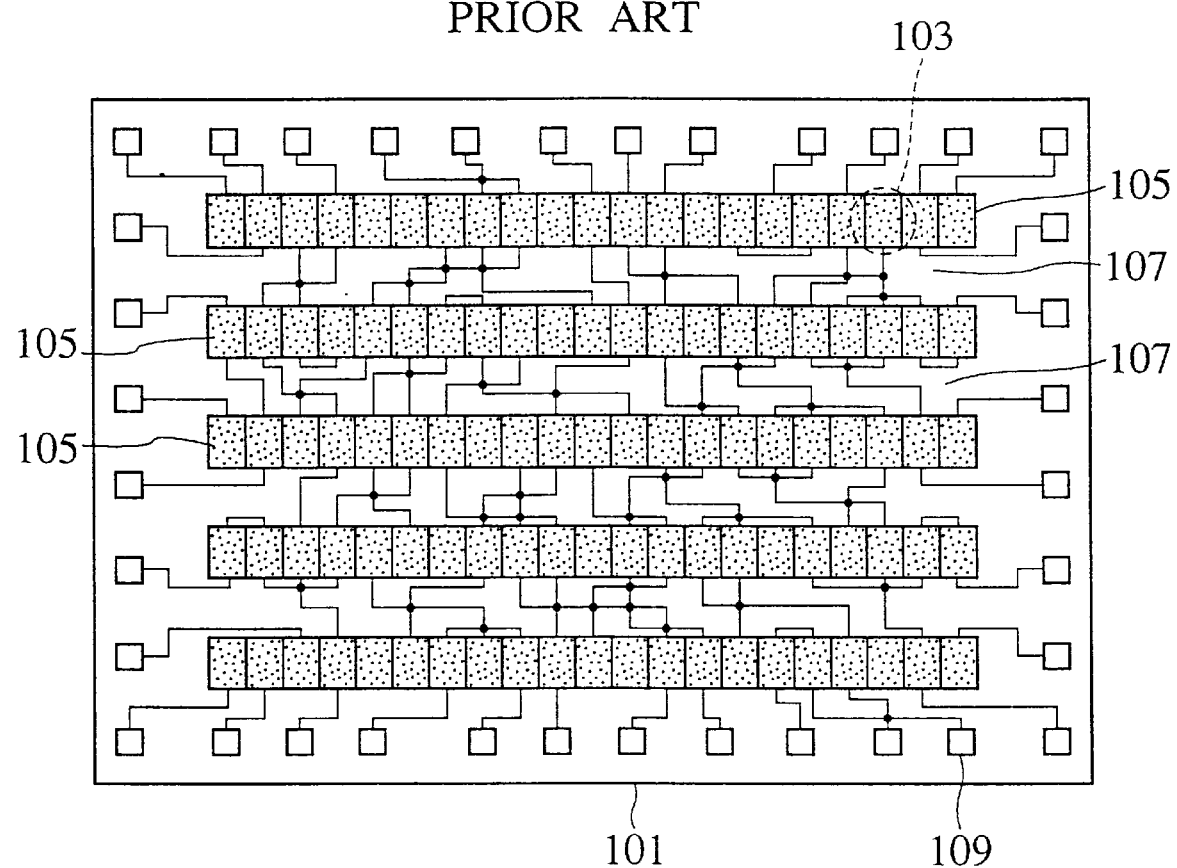
FIG. 1. is a schematic plan view showing a gate array semiconductor integrated circuit in the prior art.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified. Generally and as it is conventional in the representation of semiconductor devices, it will be appreciated that the various drawings are not drawn to scale from one figure to another nor inside a given figure, and in particular that the layer thickness are arbitrarily drawn for facilitating the reading of the drawings.

First Embodiment

Figure 5A:
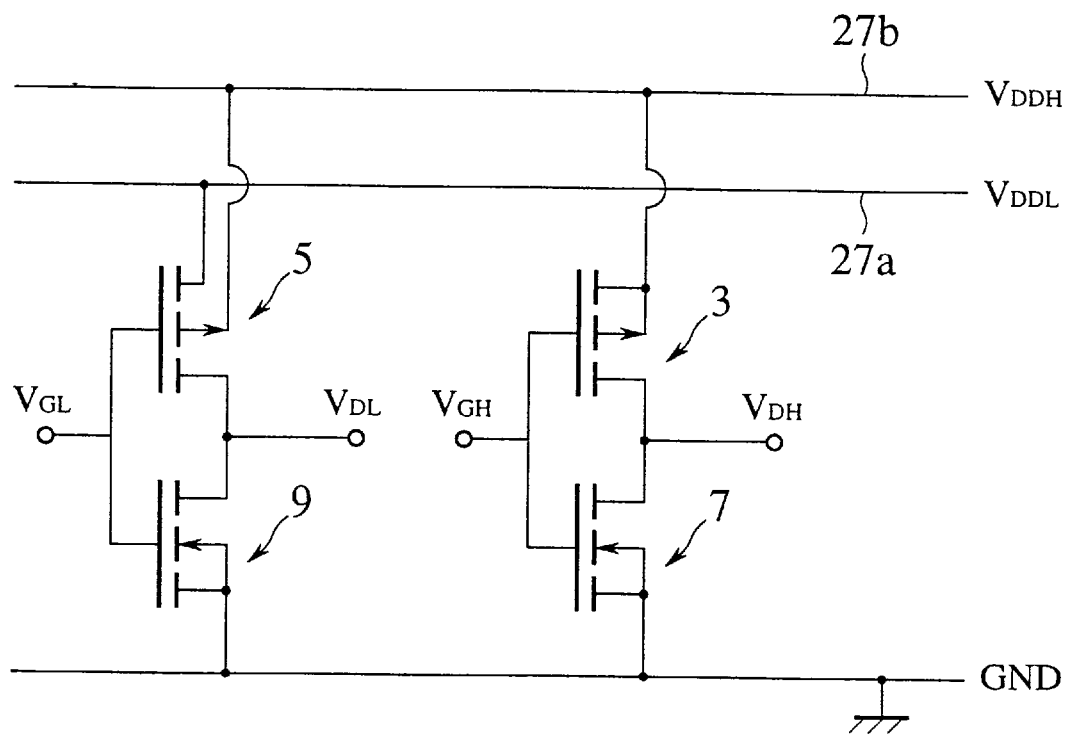
FIG. 5A is an equivalent circuit diagram showing a part of a CMOS multi-power supply integrated circuit according to a first embodiment of the present invention.
Figure 5B:
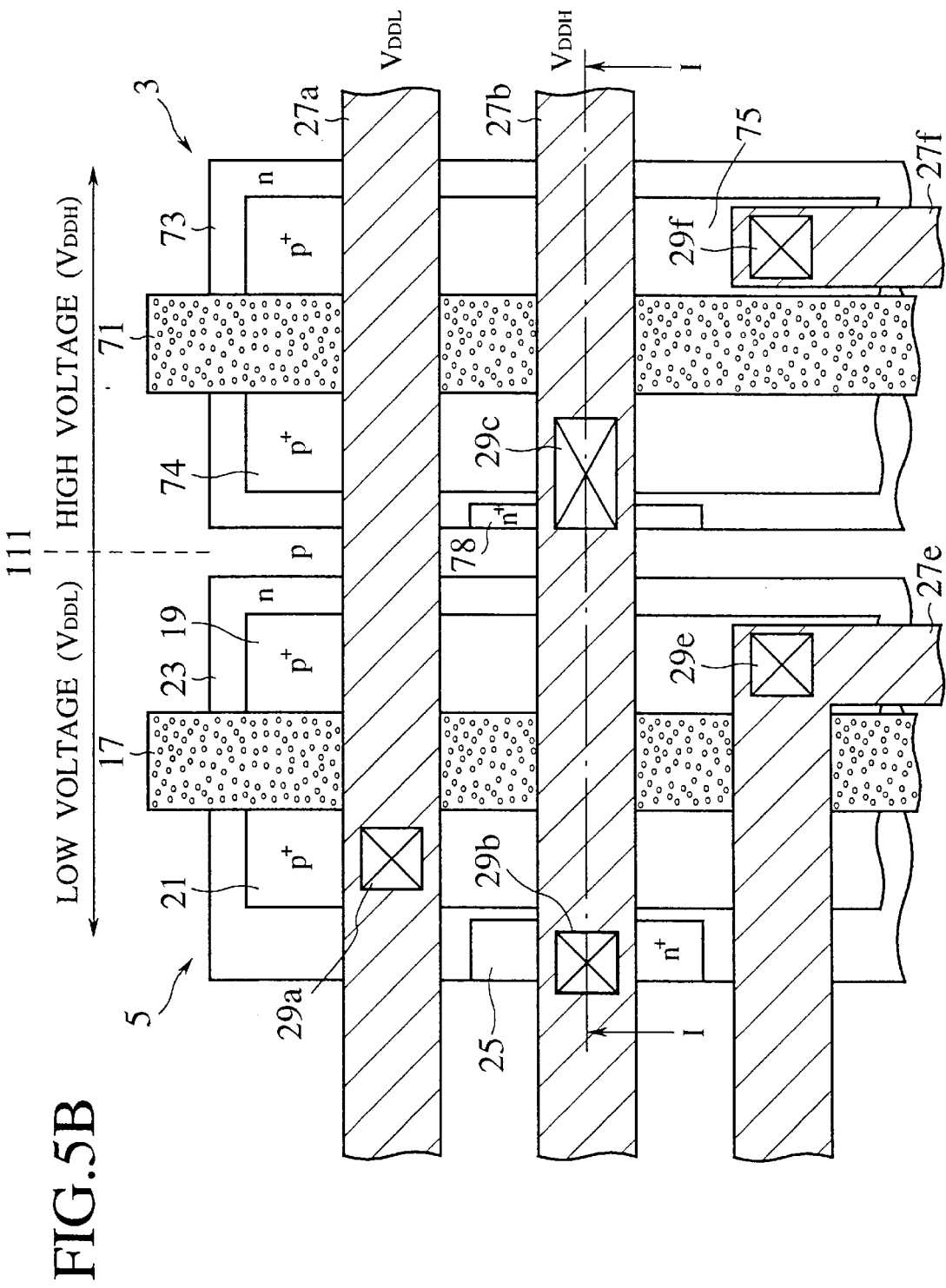
FIG. 5B is a plan view showing only a p transistor side of the CMOS multi-power supply integrated circuit shown in FIG. 5A.

FIG. 5A is an equivalent circuit diagram showing a part of a CMOS multi-power supply integrated circuit according to a first embodiment of the present invention, which is designed according to the gate array design approach. FIG. 5B is a plan view showing only pMOSs 3, 5 of the CMOS multi-power supply integrated circuit shown in FIG. 5A. FIG. 5C is a sectional view, taken along a I—I direction in FIG. 5B, showing the pMOSs 3, 5 in FIG. 5B. For the sake of simplicity, a circuit employing two supply voltages (i.e., high supply voltage ($V_{DDH}$) serving as a first supply voltage and low supply voltage ($V_{DDL}$)) serving as a second supply voltage will be explained as the multi-power supply integrated circuit. For instance, any combination such as $V_{DDH}$=5 V and $V_{DDL}$=3.3 V, $V_{DDH}$=3.3 V and $V_{DDL}$=2.0 V, or the like may be employed. As shown in FIG. 5A, the CMOS multi-power supply integrated circuit according to the present invention is made up of a CMOS consisting of a pMOS 3 and an nMOS 7, which constitute a high potential basic cell ($V_{DDH}$ cell) operated at the high supply voltage ($V_{DDH}$), and another CMOS consisting of a PMOS 5 and an nMOS 9, which constitute a low potential basic cell ($V_{DDL}$ cell) operated at the low supply voltage ($V_{DDL}$). As shown in FIG. 5B, the high potential basic cell and the low potential basic cell are placed adjacently to put a boundary line 111 therebetween. A low voltage power supply line 27a for supplying the low supply voltage ($V_{DDL}$) and a high voltage power supply line 27b for supplying the high supply voltage ($V_{DDH}$) are formed at a predetermined distance to cross over the high potential basic cell and the low potential basic cell. As shown in FIG. 5B, the low supply voltage can be supplied from the low voltage power supply line 27a to a p$^+$ source region 21 of the second PMOS 5 by connecting the low voltage power supply line 27a to the p$^+$ source region 21 via a contact hole 29a provided in an interlayer insulating film. Though the first n-well 73 in which the first pMOS 3 serving as the high potential basic cell is formed and the second n-well 23 in which the second PMOS 5 serving as the low potential basic cell is formed are formed separately, they are connected by the high voltage power supply line 27b to be at the same potential. In other words, the second n-well 23 and the first n-well 73 are connected mutually via a contact hole 29b which is opened in a second n$^+$ contact region 25 in the second n-well 23 and a contact hole 29c which is opened in a first n$^+$ contact region 78 in the first n-well 73. The contact hole 29c is formed to extend from the first n$^+$ contact region 78 to the p$^+$ source region 74. As a result, ohmic contact to both the first n$^+$ contact region 78 and the p+ source region 74 can be achieved via one contact hole. In addition, contact holes 29e, 29f are formed such that p+ drain regions 19, 75 are connected to n+ drain regions of the nMOSs 9, 7, though not shown herein, via the contact holes 29e, 29f which are formed over the p+ drain regions 19, 75 respectively.

As shown in the sectional view of FIG. 5C, the first pMOS 3 comprises a polysilicon gate electrode 71 serving as a gate, a p+ diffusion layer 75 serving as a drain region, a p+ diffusion layer 74 serving as a source region, and a first n+ contact region 78 for supplying the supply voltage to the first n-well 73. In a similar manner, the second pMOS 5 comprises a polysilicon gate electrode 17 serving as a gate, a p+ diffusion layer 19 serving as a drain region, a p+ diffusion layer 21 serving as a source region, and a second n+ contact region 25 for supplying the first supply voltage to the second n-well 23. Field oxide films 91 are formed on peripheral regions of the first and second n-wells 73, 23 respectively. Transistor regions are defined by respective window portions of the field oxide films 91. An interlayer insulating film 92 made of $SiO_2$ film, PSG film, BPSG film, or the like is formed on the polysilicon gate electrodes 71, 17, the field oxide films 91, etc. Although a resultant configuration up to now are fundamentally similar to the configuration of the multi-power supply integrated circuit explained previously as the preliminary stage of the present invention and shown in FIG. 3, the present invention is different from the configuration shown in FIG. 3 in that the low supply voltage ($V_{DDL}$) is not supplied to the second n-well 23 of the second pMOS 5 serving as the low potential basic cell, but the high supply voltage ($V_{DDH}$) is supplied to the second n-well 23 by bring the second n+ contact region 25 and the high voltage power supply line 27b into ohmic-contact mutually via the contact hole 29b. This respect is indeed a key feature of the first embodiment of the present invention, and the configuration shown in FIGS. 5A, 5B, and 5C can suppress carrier injection which is the disadvantage of the configuration shown in FIG. 3. Accordingly, reliability of the integrated circuit can be improved and at the same time an increase of the chip area can be prevented.

More particularly, in the first embodiment of the present invention, since the high supply voltage ($V_{DDH}$) is supplied to both the first n-well 73 of the first pMOS 3 serving as the high potential basic cell and the second n-well 23 of the second pMOS 5 serving as the low potential basic cell, two n-wells 73, 23 are set at the same potential. That is, in the first embodiment of the present invention, since there is no potential difference between two n-wells 73, 23, carrier injection between the n-wells 73, 23 can be suppressed without requiring a high resistance between the adjacent n-wells. Hence, unlike the configuration shown in FIG. 3, both the n-wells 73, 23 can be placed in close vicinity to each other to thereby yield reduction in the chip area because there is no necessity of separating the high potential basic cell from the low potential basic cell at a certain interval.

Figure 3:
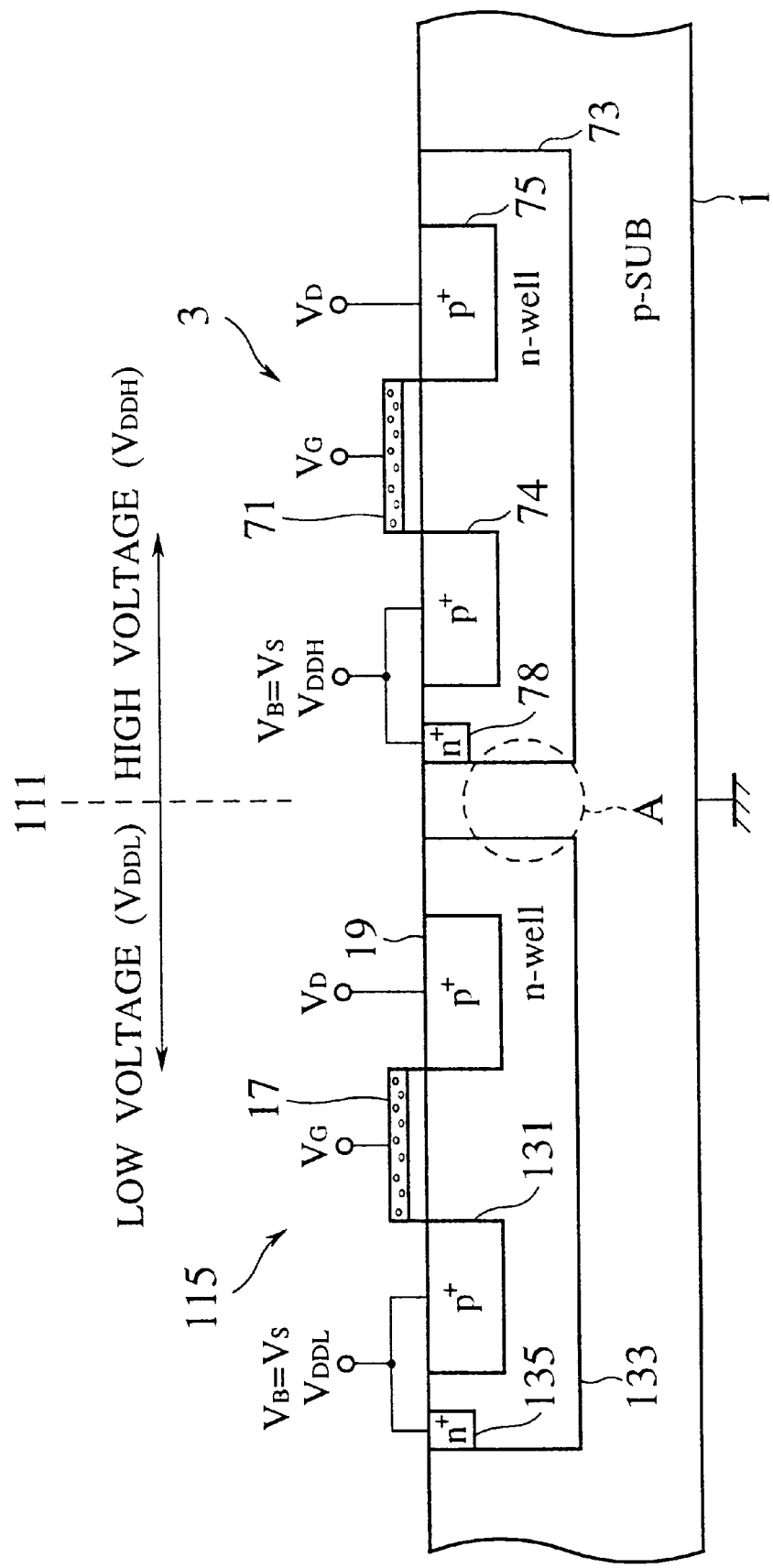
FIG. 3 is sectional view showing a multi-power supply integrated it which has been examined by inventors of the present invention in the course of making the present invention.
Figure 4:
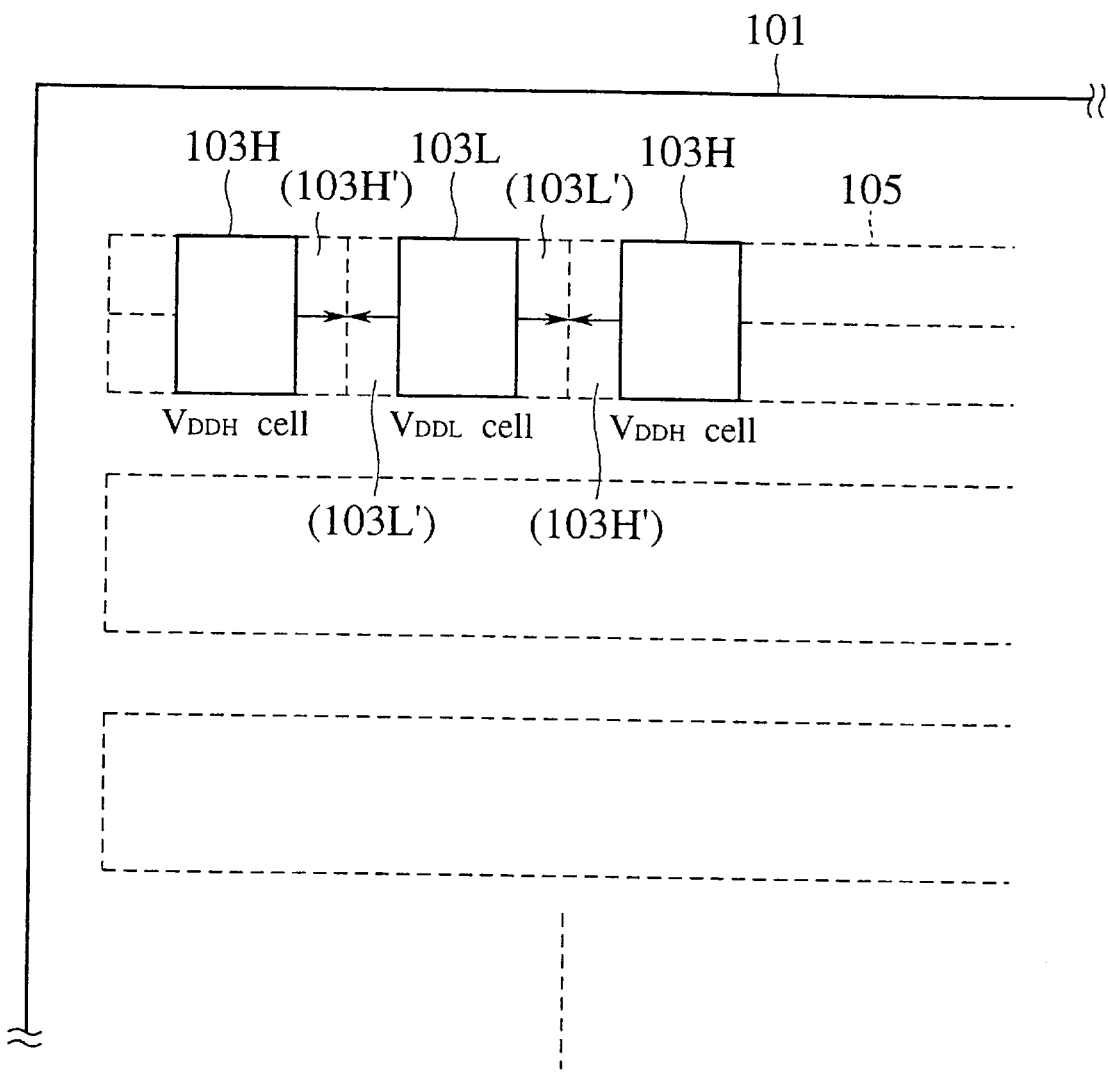
FIG. 4 is a plan view showing a gate array having multi-power supply integrated circuit which has been examined by inventors of the present invention as a preliminary stage of the present invention.

In FIG. 5C, the high supply voltage ($V_{DDH}$) is applied to the p+ source region 74 in the first PMOS 3 constituting the high potential basic cell, which is similar to the configuration shown in FIG. 3. In contrast, not the low supply voltage ($V_{DDL}$) which is to be supplied in a conventional circuit, but the high supply voltage ($V_{DDH}$) is applied to the second n-well 23 having the second PMOS 5 constituting the low potential basic cell. Hence, a potential difference appears between the p+ source region 21 and the second n-well 23. However, since this potential difference acts as backward bias against a diode (pn junction) B formed between the p+ source region 21 and the second n-well 23. Then, no current is induced between the p+ source region 21 and the second n-well 23 because of such potential difference. Consequently, the performance of the second pMOS 5 is in no way degraded.

Second Embodiment

Figure 6A:
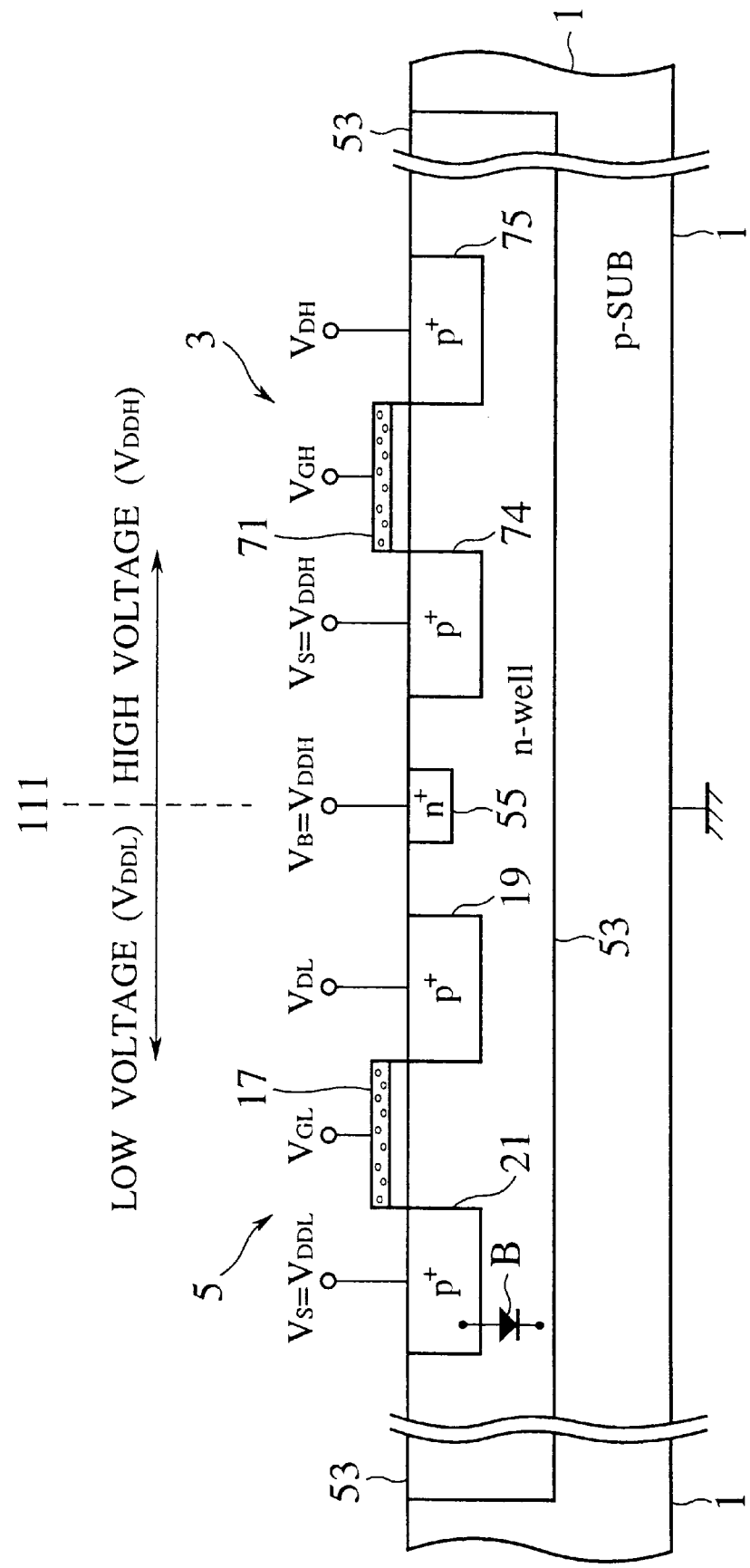
FIG. 6A is a sectional view showing a multi-power supply integrated circuit according to a second embodiment of the present invention.

FIG. 6A is a sectional view showing a PMOS side of a CMOS multi-power supply integrated circuit according to a second embodiment of the present invention. This multi-power supply integrated circuit also employs, like the first embodiment, two supply voltages (i.e., the high supply voltage ($V_{DDH}$) and the low supply voltage ($V_{DDL}$)). As has explained in the first embodiment, the present invention is characterized in that the same high supply voltage is employed as the first supply voltages being supplied to respective n-wells located on the high and low potential sides. Therefore, as shown in FIG. 6A, such n-wells located on the high and low potential sides are formed as a single common n-well 53. For this reason, in the second embodiment of the present invention, the first pMOS 3 and the second pMOS 5 to be arranged adjacently or the high potential basic cell and the low potential basic cell to be arranged adjacently can be placed more closely than the multi-power supply integrated circuit discussed in the first embodiment.

As shown in FIG. 6A, in the multi-power supply integrated circuit according to the second embodiment of the present invention, the common n-well 53 is at first formed on the p substrate 1, and then the first pMOS 3 which constitutes the high potential basic cell ($V_{DDH}$ cell) operated at the high supply voltage ($V_{DDH}$) and the second pMOS 5 which constitutes the low potential basic cell ($V_{DDL}$ cell) operated at the low supply voltage ($V_{DDL}$) are placed adjacently in the n-well 53 so as to put a boundary line 111 therebetween. An n+ contact region 55 is formed in the n-well 53 to apply the first supply voltage to the n-well 53. The first pMOS 3 comprises the polysilicon gate electrode 71, the p+ drain region 75, and the p+ source region 74. Similarly, the second pMOS 5 comprises the polysilicon gate electrode 17, the p+ drain region 19, and the p+ source region 21.

Figure 6B:
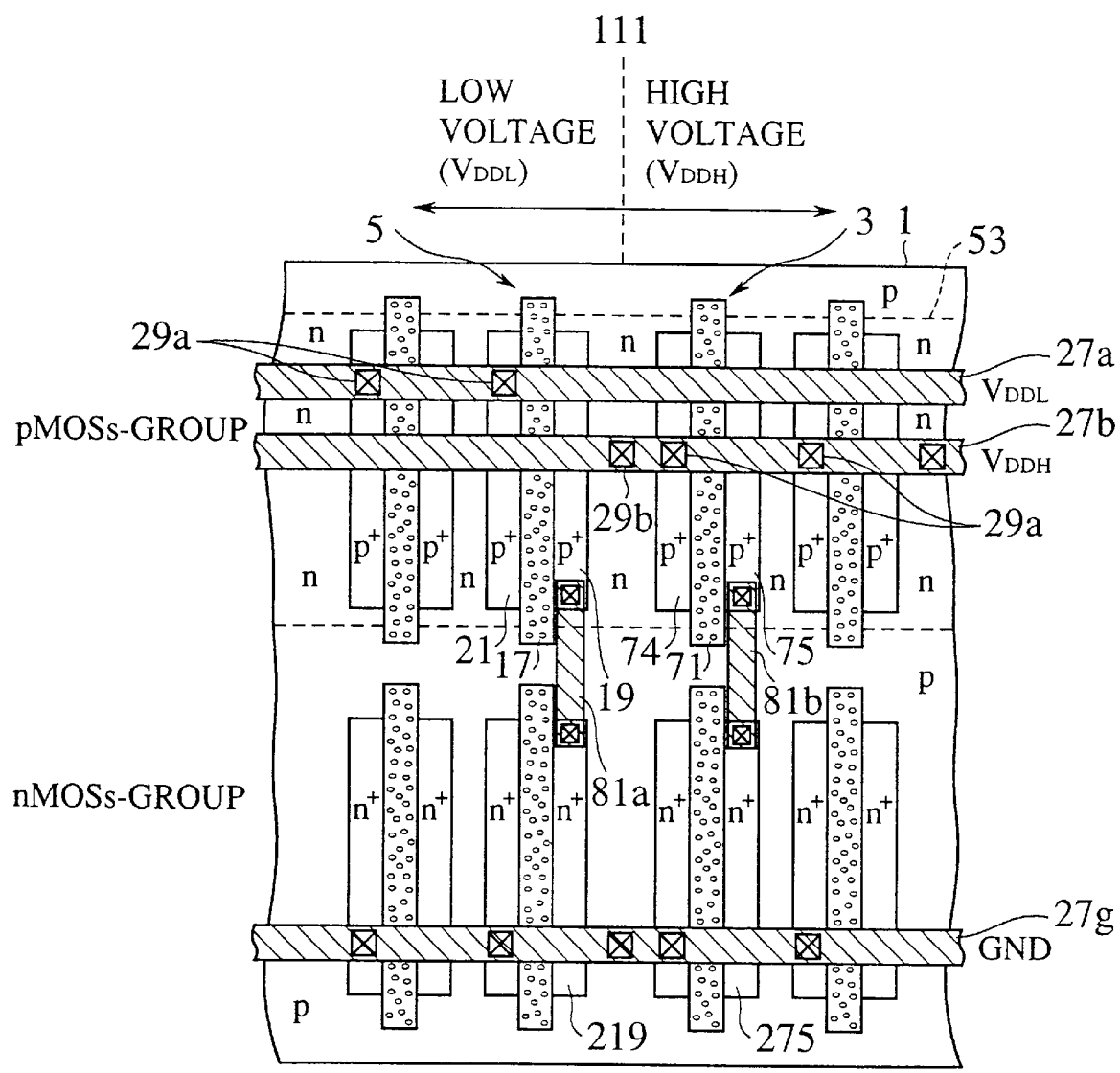
FIG. 6B is a plan view showing the multi-power supply integrated circuit according to the second embodiment of the present invention.

As shown in FIG. 6B, for example, the first supply voltage can be applied to the n-well 53 through the $V_{DDH}$ power supply line 27b connected to a contact hole 29b. The contact hole 29b is provided in the interlayer insulating film, which are not illustrated in FIG. 6A. The contact hole 29b is formed on the n+ contact region 55 at the top of the n-well 53. The p+ drain region 75 is connected to an n+ drain region 275 of an nMOS via a signal line 81b. The p+ drain region 19 is connected to an n+ drain region 219 of another nMOS via a signal line 81a.

In the second embodiment of the present invention, since both the first pMOS 3 disposed in the high potential basic cell and the second PMOS 5 disposed in the low potential basic cell are formed in the common n-well 53 and the high supply voltage ($V_{DDH}$) is supplied to the n-well 53, no potential difference between the n-wells, which has been discussed as the disadvantage in FIG. 3, is in essence present. Inherently, the problem of carrier injection between the n-wells does not arise. Therefore the reduction in the chip size of the integrated circuit can be attained by placing more closely the high potential basic cell and the low potential basic cell.

In the second embodiment of the present invention, in the first pMOS 3 constituting the high potential basic cell, a potential distribution in respective portions are the same as those in the ordinary pMOS since the high supply voltage ($V_{DDH}$) equal to the source voltage is applied to the n-well 53. In the second pMOS 5 constituting the low potential basic cell, a potential difference appears between the p$^+$ source region 21 and the n-well 53 since not the low supply voltage ($V_{DDL}$) serving as the source voltage, but the high supply voltage ($V_{DDH}$) is applied to the n-well 53. Nevertheless, since this potential difference acts as backward bias against a diode (pn junction) B formed between the p$^+$ source region 21 and the n-well 53, no current flows between the p$^+$ source region 21 and the n-well 53 due to this potential difference and therefore the operation of the PMOS 5 is never degraded.

Figure 6C:
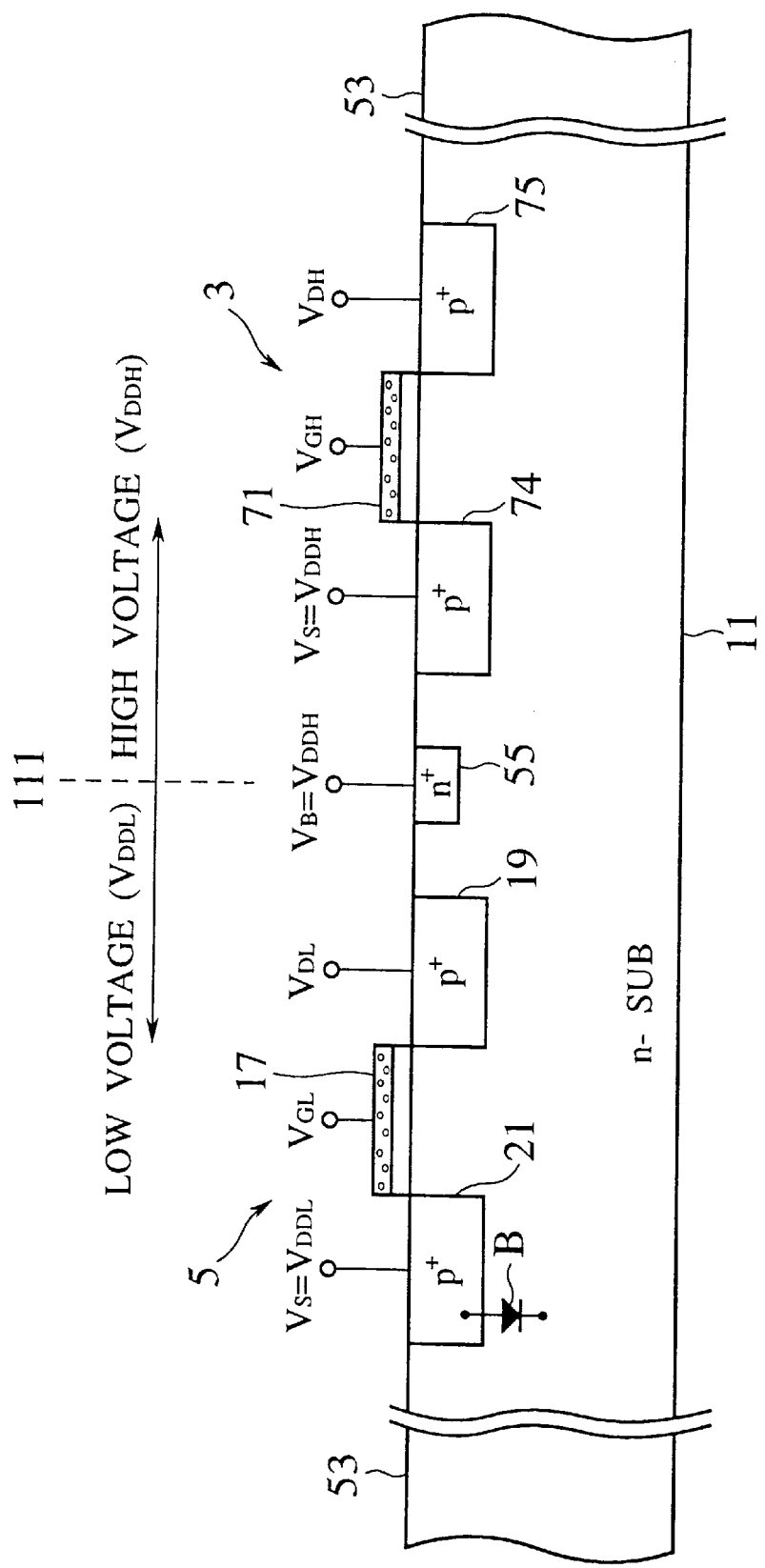
FIG. 6C is a sectional view showing a multi-power supply integrated circuit according to a modification of the second embodiment of the present invention.

Furthermore, the n-well is not always required because plural n-wells may be formed as a single n-well. In other words, as shown in FIG. 6C, both the pMOSs 3, 5 may be formed directly on an n substrate 11.

Figure 6D:
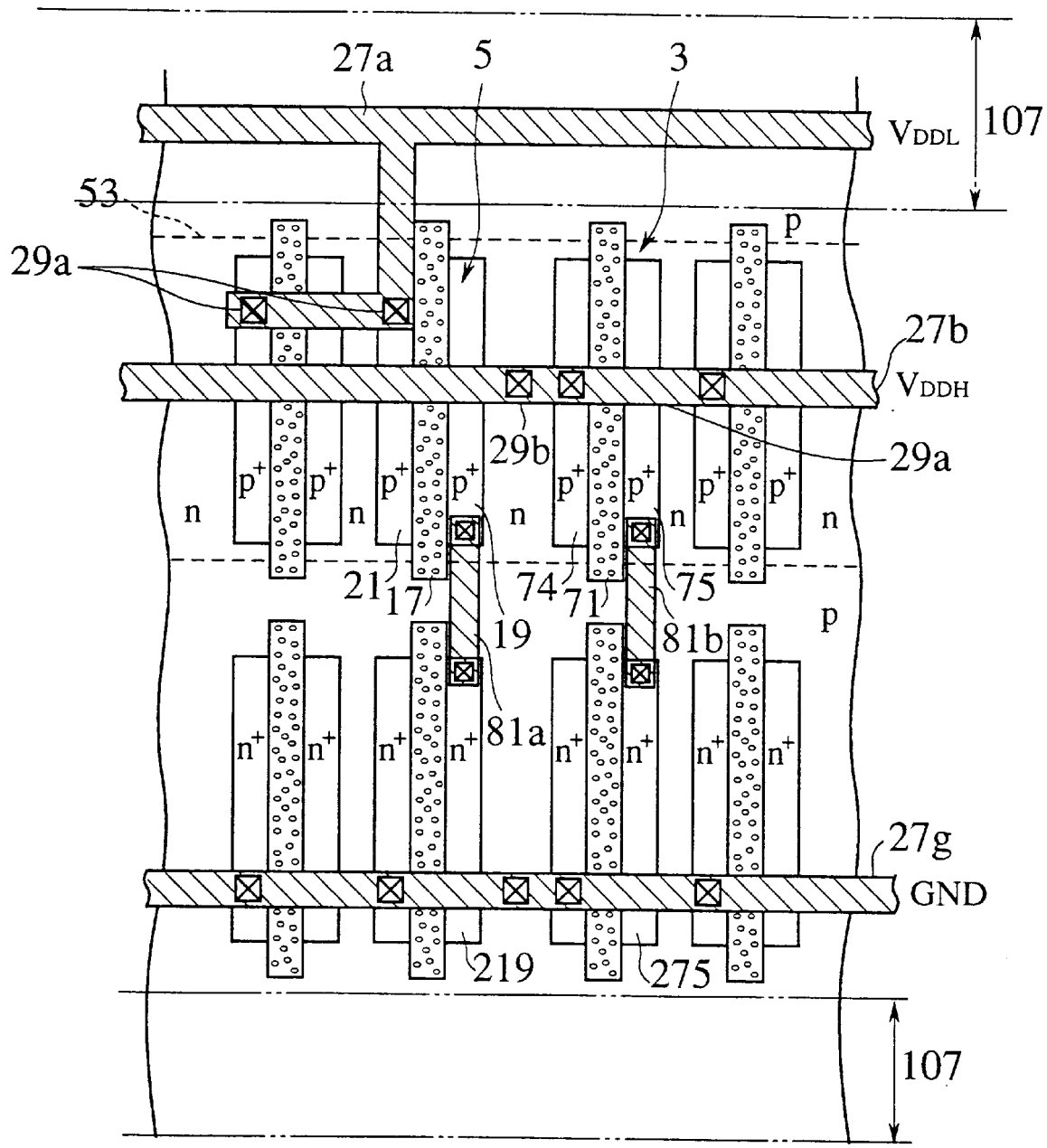
FIG. 6D is a plan view showing the multi-power supply integrated circuit in which power supply lines are provided in wiring channels.

Although the power supply lines 27a, 27b, 27g are formed on respective basic cells in FIG. 6B, the low voltage power supply line 27a may be formed on the wiring channels shown in FIG. 1, as shown in FIG. 6D, by extending a part of the low voltage power supply line 27a along the vertical direction. Hence, the basic cells which are being used in the prior art may also be used, as it is, without a change of design.

Third Embodiment

Next, a CMOS multi-power supply integrated circuit according to a third embodiment of the present invention will be explained with reference to FIGS. 7A to 7D hereunder. Only pMOS transistors in all the transistors constituting CMOS circuits will be explained in the third embodiment, like the first and second embodiments. The third embodiment of the present invention improves on the multi-power supply integrated circuit according to the first or second embodiment in that the peak performance of the second pMOS operated at the low supply voltage can be maintained by compensating previously a change of the threshold voltage $V_{th}$ in the second pMOS up to a predetermined value, whereby improving transistor's current driving capabilities so that an operation speed of the circuit can be improved. That is, in the above second pMOS 5 shown in FIG. 5B (the first embodiment), a source to n-well voltage $V_{BS}$ is given by $V_{BS}=V_{DDH}-V_{DDL}$ (>0) since the source voltage $V_S=V_{DDL}$ and the n-well voltage $V_B=V_{DDH}$ during operation. Hence, "a substrate bias effect" is caused in the second pMOS 5. In general, the substrate bias effect means that, when the backward bias is applied between the source of the MOS transistor and "the substrate" (the well if the well structure is employed), an absolute value of the threshold voltage $V_{th}$ is increased correspondingly to the backward bias voltage. According to the substrate bias effect, the absolute value of the threshold voltage $V_{th}$ is also increased in the second pMOS 5 correspondingly to the voltage $V_{BS}=V_{DDH}-V_{DDL}$. Namely, the threshold voltage $V_{th}$ of the pMOS 5 is increased negatively according to the substrate bias effect. This increase in the absolute value of the threshold voltage $V_{th}$ brings about reduction in the drain current under the same supply voltage, thereby causing a speed-performance degradation to increase a signal transfer time.

For this reason, such a configuration will be employed in the third embodiment of the present invention that a degree of increase in the absolute value of the threshold voltage $V_{th}$ due to the above voltage $V_{BS}$ can be estimated in advance and then the variation of the absolute value of the threshold voltage $V_{th}$ can be compensated beforehand by such estimated value. In other words, because such increase of the absolute value of the threshold voltage $V_{th}$ due to the substrate bias effect can be canceled not to thus cause reduction in the transistors' current driving capability, signal delay can be made small. Accordingly, the speed-performance of the integrated circuit can be improved.

FIG. 7A is a sectional view showing a detailed configuration of the multi-power supply integrated circuit according to the third embodiment of the present invention. As in the first embodiment, this multi-power supply integrated circuit also employs two supply voltages (i.e., the high supply voltage ($V_{DDH}$) and the low supply voltage ($V_{DDL}$)).

As shown in FIG. 7A, the first and second n-well 73, 23 are formed in the surface area of the p silicon (100) substrate 1 and two transistor regions are defined by the field oxide film 91. The p$^+$ drain region 75 and the p$^+$ source region 74 of the first pMOS 3 serving as the high potential basic cell and the p$^+$ drain region 19 and the p$^+$ source region 21 of a second pMOS 61 serving as the low potential basic cell are formed in the window regions of the field oxide film 91 respectively. Besides, the polysilicon gate electrodes 71, 17 are formed on the gate oxide films which are formed on the channel regions between the source/drain regions. The interlayer insulating film 92 made of SiO$_2$ film, PSG film, BPSG film, etc. is deposited on the field oxide film 91 and the polysilicon gate electrodes 71, 17. An upper surface of the interlayer insulating film 92 may be planarized by chemical mechanical polishing (CMP), etc., as the case may be. The high voltage power supply line 27b made of Al, Al—Si, Al—Cu—Si, or the like is formed on the interlayer insulating film 92. The high supply voltage ($V_{DDH}$) is applied to the n-wells 23, 73 via the contact holes 29b, 29c formed in the interlayer insulating film 92. The p$^+$ drain regions 75, 19 are connected to the n$^+$ drain regions of the nMOSs, though not shown, by predetermined metal wirings via predetermined contact holes. Also the low voltage power supply line is connected to the p$^+$ source region 21. In the third embodiment of the present invention, in order to compensate the variation of the threshold voltage $V_{th}$ of the second pMOS 61, the threshold value can be controlled by implanting ions into an area located directly beneath the polysilicon gate electrode 17. As shown in FIG. 7A, the absolute value of the threshold voltage $V_{th}$ can be lowered to a target value by implanting p type impurity (e.g., boron $^{11}$B$^+$), whose conductivity type is opposite to the n-well 23, to a channel region 59 of the second pMOS transistor 61 up to a predetermined dosage.

Figure 7B:
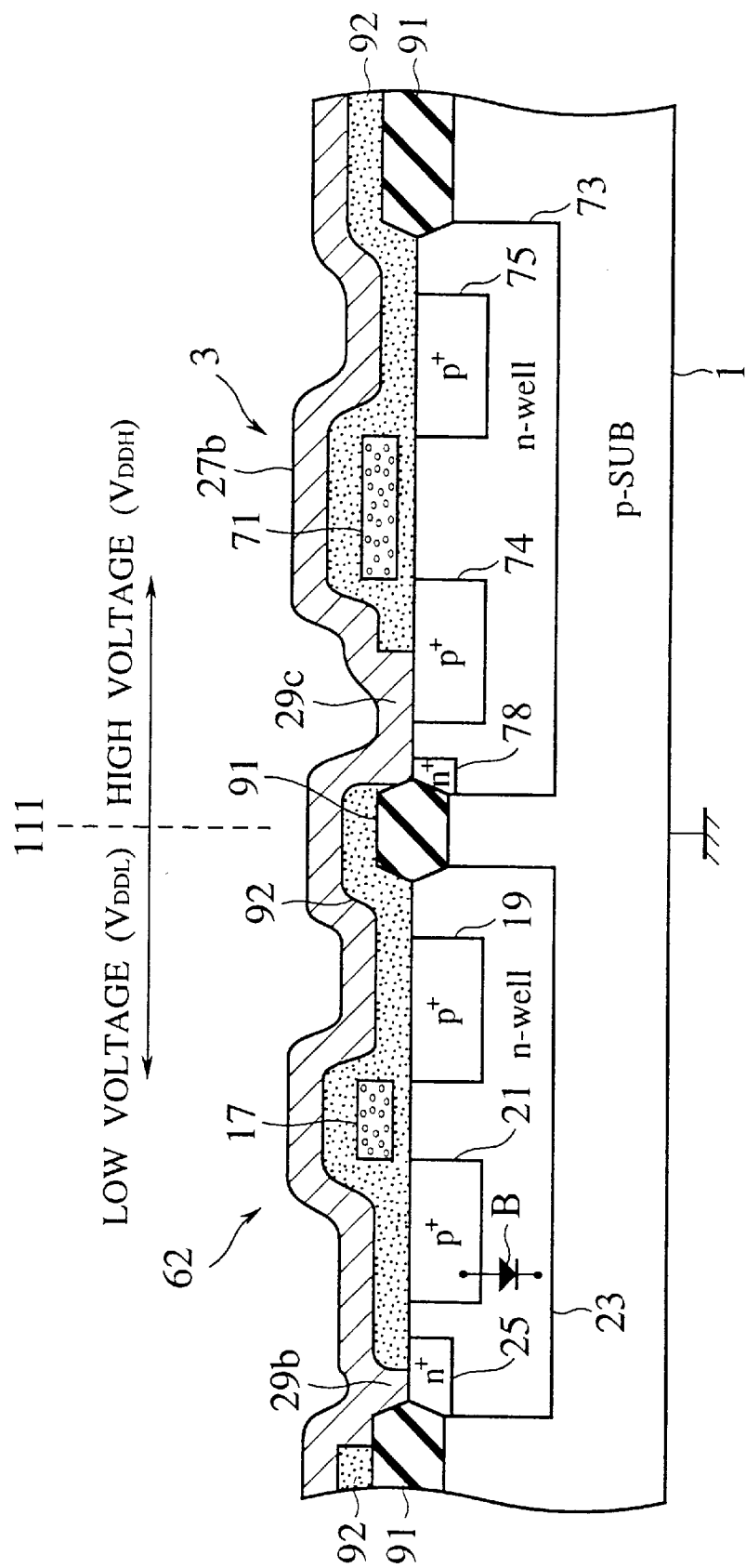
FIG. 7B is a sectional view showing a multi-power supply integrate circuit according to a modification of the third embodiment of the present invention.

As another approach, as shown in FIG. 7B, a gate length of the second pMOS 62 serving as the low potential basic cell can be made shorter than the first pMOS 3 serving as the high potential basic cell.

Figure 7D:
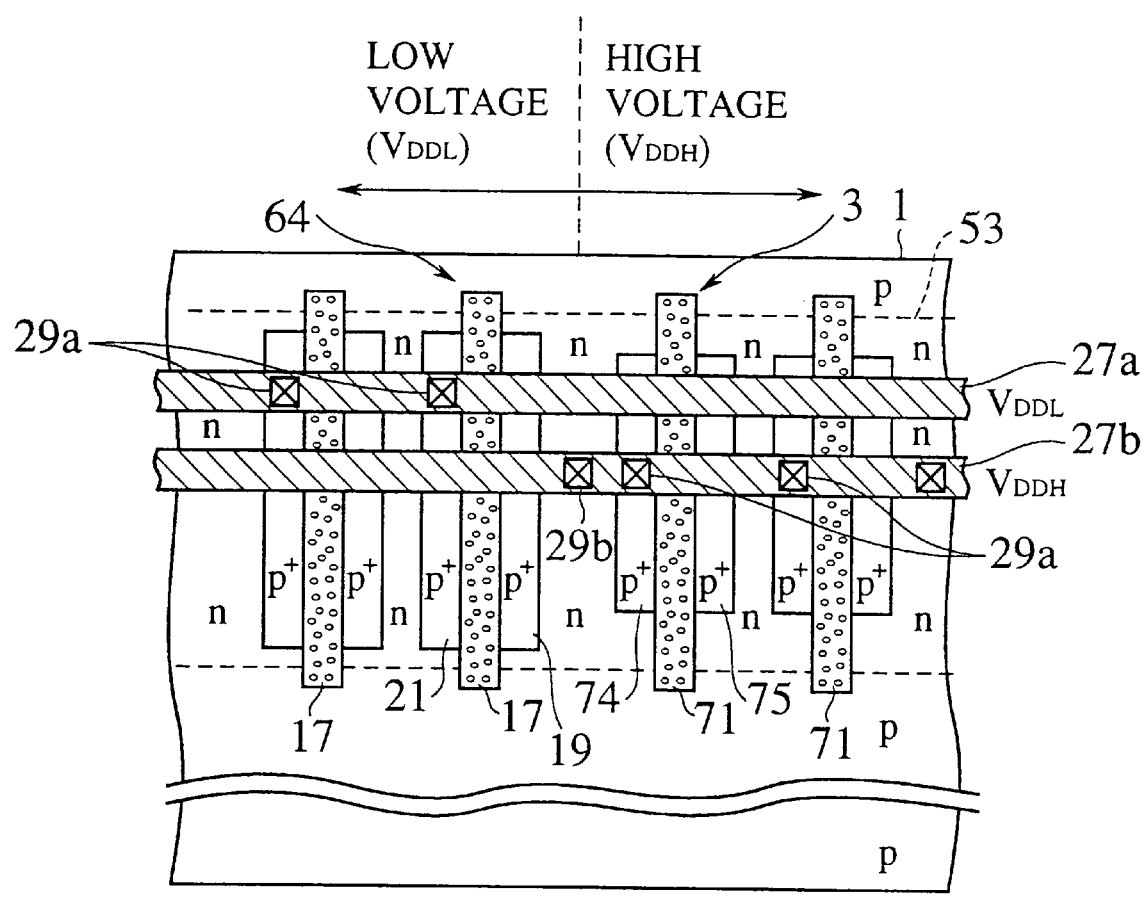
FIG. 7D is a plan view showing a multi-power supply integrated circuit according to still another modification of the third embodiment of the present invention.

FIGS. 7C and 7D show respectively the cases where second pMOSs 63, 64 serving as the low potential basic cell respectively and the first pMOS 3 serving as the high potential basic cell are formed in the common n-well 53. The high supply voltage ($V_{DDH}$) is applied to the n-well 53 via the contact hole 29d in FIG. 7C whereas the high supply voltage ($V_{DDH}$) is applied to the n-well 53 via the contact hole 29b in FIG. 7D. As shown in FIG. 7C, a thickness of a gate oxide film 99 of the second pMOS 63 may be made thinner than a gate oxide film 98 of the pMOS 3. As shown in FIG. 7D, a gate width of the second pMOS 64 may be made longer than a gate width of the first pMOS 3 to compensate the decrease of drain current in the second pMOS 64 due to the substrate bias effect.

Figure 7E:
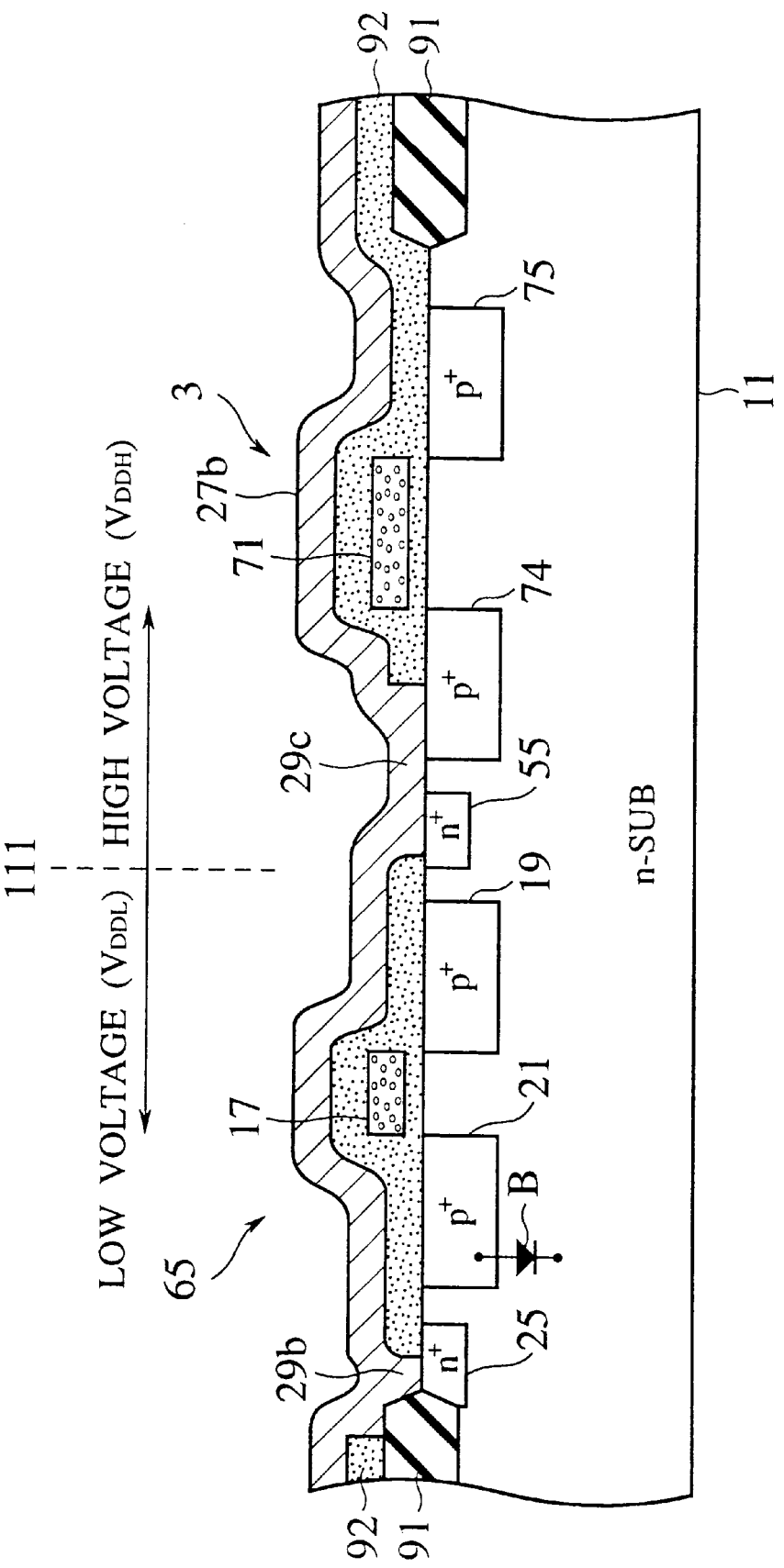
FIG. 7E is sectional view showing a multi-power supply integrated circuit according to yet still another modification of the third embodiment of the present invention.

FIGS. 7E and 7F are sectional views showing multi-power supply integrated circuits according to yet still another modifications of the third embodiment of the present invention, which correspond to the case where all pMOSs 3, 65, 66 are formed on the n substrate 11. In FIG. 7E, a gate length of the second pMOS 65 is made short rather than a gate length of the first pMOS 3 to thus adjust the variation of its gate threshold voltage $V_{th}$. In FIG. 7F, a thickness of the gate oxide film 99 of the second pMOS 66 is made thin rather than a thickness of the gate oxide film 98 of the first pMOS 3 to thus adjust the variation of its gate threshold voltage $V_{th}$. In this fashion, by adjusting the variation of the gate threshold voltage of the second pMOS formed on the low potential basic cell side with respect to the gate threshold voltage of the first pMOS formed on the high potential basic cell side, the signal delay can be prevented and in addition the operation speed of the integrated circuit can be improved.

Fourth Embodiment

Next, a multi-power supply integrated circuit system according to a fourth embodiment of the present invention will be explained hereunder. The fourth embodiment of the present invention is so constituted that, in contrast to the multi-power supply integrated circuit according to the first to third embodiments, two supply voltages (i.e., the high supply voltage ($V_{DDH}$) and the low supply voltage ($V_{DDL}$)) to be applied to the pMOSs in the low potential basic cells are always applied in a preselected sequence. In other words, in the pMOS 5 shown in FIG. 8, forward bias may be applied between the $p^+$ source region 21 and the n-well 23, if it occurs the event that a difference in rise time of two supply voltages are generated and therefore the low supply voltage ($V_{DDL}$) is applied only to the $p^+$ source region 21 before the high supply voltage ($V_{DDH}$) is applied to the n-well 23. This forward bias causes a current to flow between the $p^+$ source region 21 and the n-well 23, whereby causing a malfunction of the pMOS 5. Accordingly, in order to prevent such situation, a system designer has to design a system with due regard to an application sequence of two supply voltages ($V_{DDH}$, $V_{DDL}$). Thus the system design is made complicated.

Figure 9A:
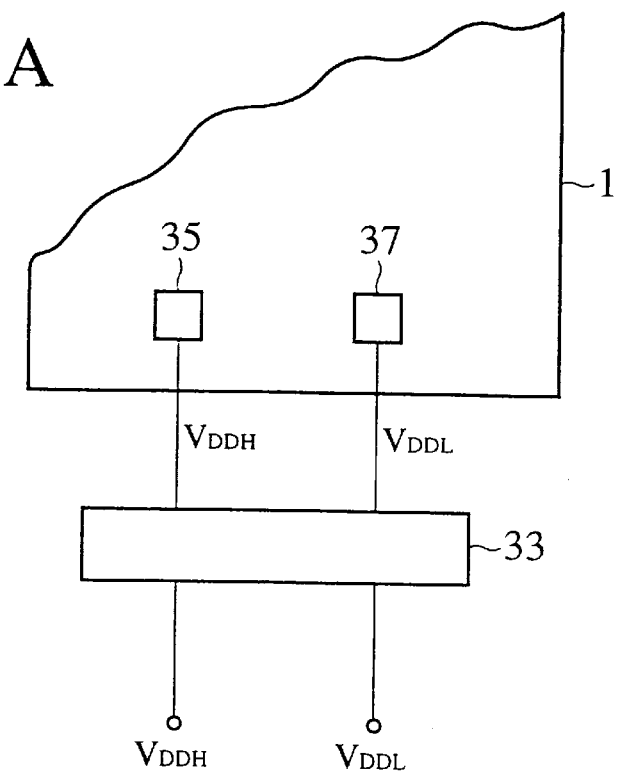
FIG. 9A is a schematic plan view showing the multi-power supply integrated circuit system according to the fourth embodiment of the present invention.

However, in the fourth embodiment of the present invention, as shown in FIG. 9A, in order not to apply forward bias between the $p^+$ source region 21 and the n-well 23, the high supply voltage ($V_{DDH}$) and the low supply voltage ($V_{DDL}$) supplied from the outside are connected respectively to a high supply voltage pad 35 and a low supply voltage pad 37 provided on the semiconductor chip 1 via a supply voltage control circuit 33. That is, if the supply voltage control circuit 33 can always control to apply first the high supply voltage and then the low supply voltage to the semiconductor chip 1, the forward bias can be prevented from being applied between the $p^+$ source region 21 and the n-well 23. Hence, the system designer can design the system readily without regard to the application sequence of two power supply voltages ($V_{DDH}$, $V_{DDL}$). For instance, a DC—DC converter having the above sequence controlling function may be employed as the supply voltage control circuit 33.

Figure 9B:
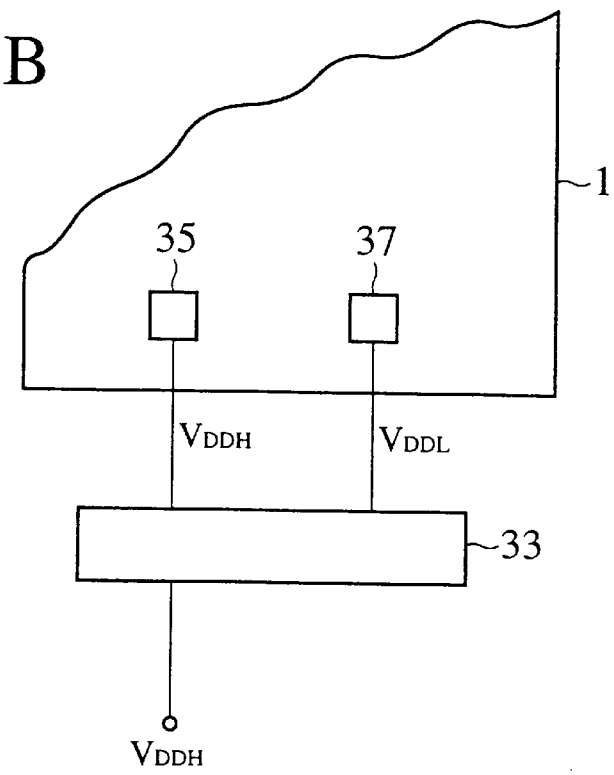
FIG. 9B is a schematic plan view showing a multi-power supply integrated circuit system according to a modification of the fourth embodiment of the present invention.

FIG. 9B is a schematic plan view showing a multi-power supply integrated circuit system according to a modification of the fourth embodiment of the present invention, wherein only the high supply voltage $V_{DDH}$ is supplied from the outside of the supply voltage control circuit 33. The DC—DC converter is employed as the supply voltage control circuit 33. This DC—DC converter generates the low supply voltage $V_{DDL}$ therein, and then supplies the high supply voltage ($V_{DDH}$) to the high supply voltage pad 35 on the semiconductor chip 1 and then the low supply voltage ($V_{DDL}$) to the low supply voltage pad 37. The supply voltage control circuit 33 can always control to apply first the high supply voltage ($V_{DDH}$) and thereafter the low supply voltage ($V_{DDL}$). As a result, it is not necessary for the system designer to consider once again the application sequence of two supply voltages ($V_{DDH}$, $V_{DDL}$) during system design, so that the system design can be facilitated.

Figure 9C:
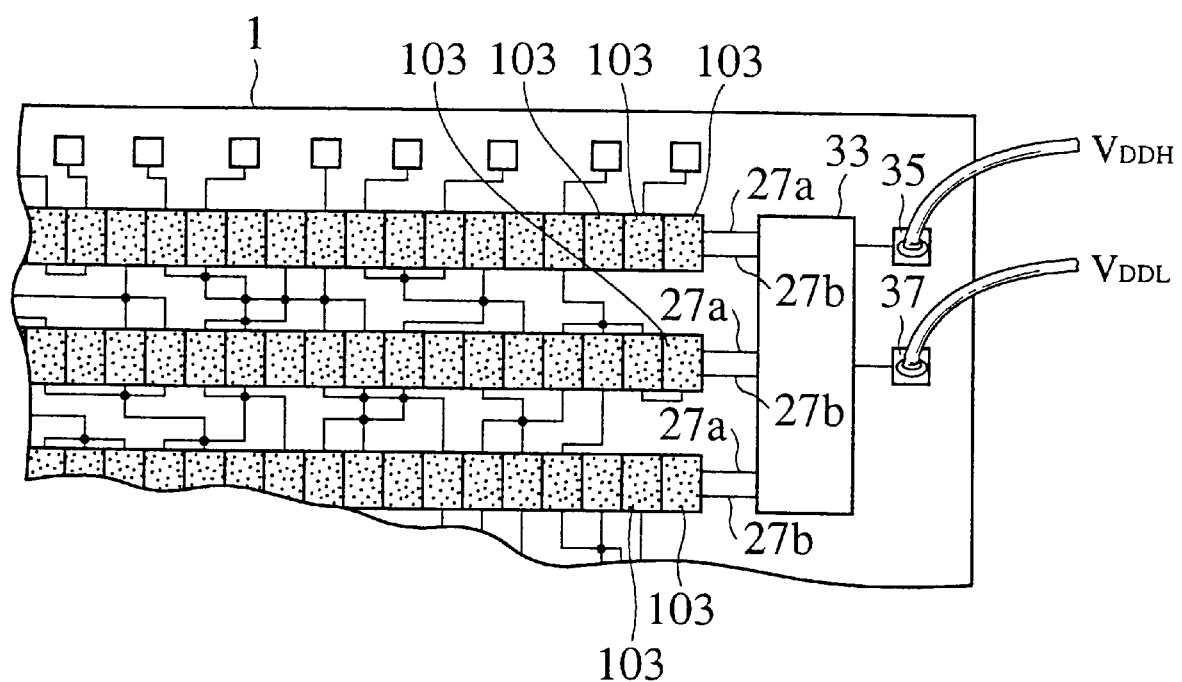
FIG. 9C is a schematic plan view showing a part of a semiconductor chip on which a supply voltage control circuit of the multi-power supply integrated circuit system according to the fourth embodiment of the present invention is mounted together.
Figure 9D:
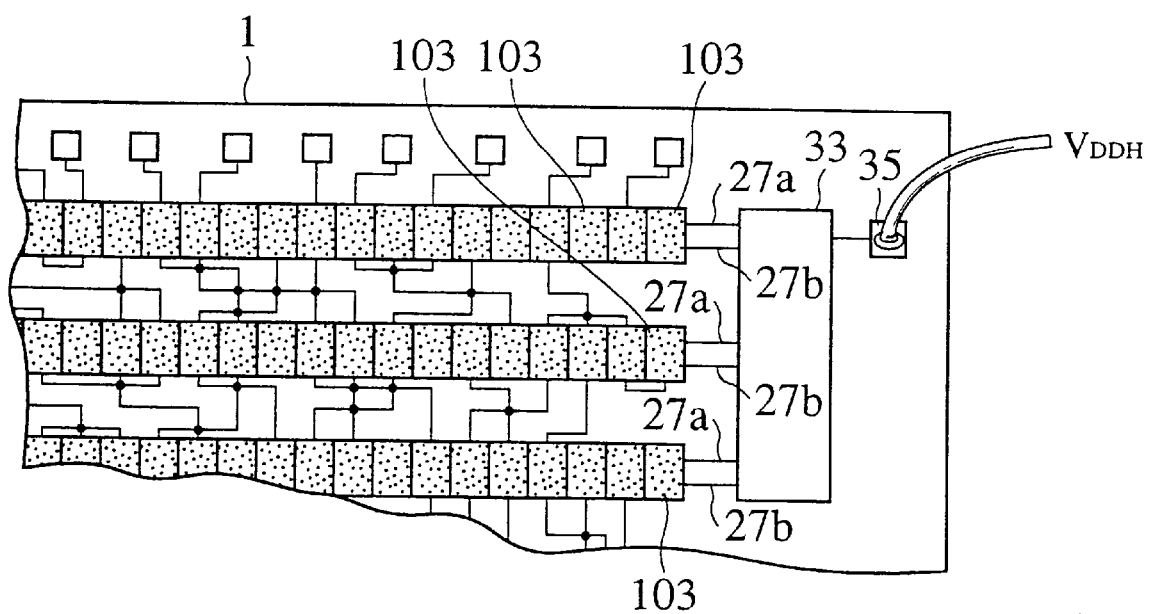
FIG. 9D is a plan view showing another example of a semiconductor chip on which another supply voltage control circuit of the multi-power supply integrated circuit system according to the fourth embodiment of the present invention is mounted together.

FIGS. 9C and 9D show still another modifications of the fourth embodiment of the present invention, wherein the supply voltage control circuit 33 and gate arrays, which have been explained in the first to third embodiments, are mounted together on the same semiconductor chip. In FIG. 9C two bonding pads 35, 37 are provided to receive two supply voltages ($V_{DDH}$, $V_{DDL}$), while in FIG. 9D only the high supply voltage ($V_{DDH}$) is supplied to the supply voltage control circuit 33 via the bonding pad 35. Also in FIG. 9D two supply voltages ($V_{DDH}$, $V_{DDL}$) are generated in the supply voltage control circuit 33 with the use of the DC—DC converter, etc., and then two supply voltages ($V_{DDH}$, $V_{DDL}$) are supplied to the basic cells 103 constituting the gate arrays via the low voltage power supply line 27a and the high voltage power supply line 27b in a preselected sequence.

Fifth Embodiment

Figure 10A:
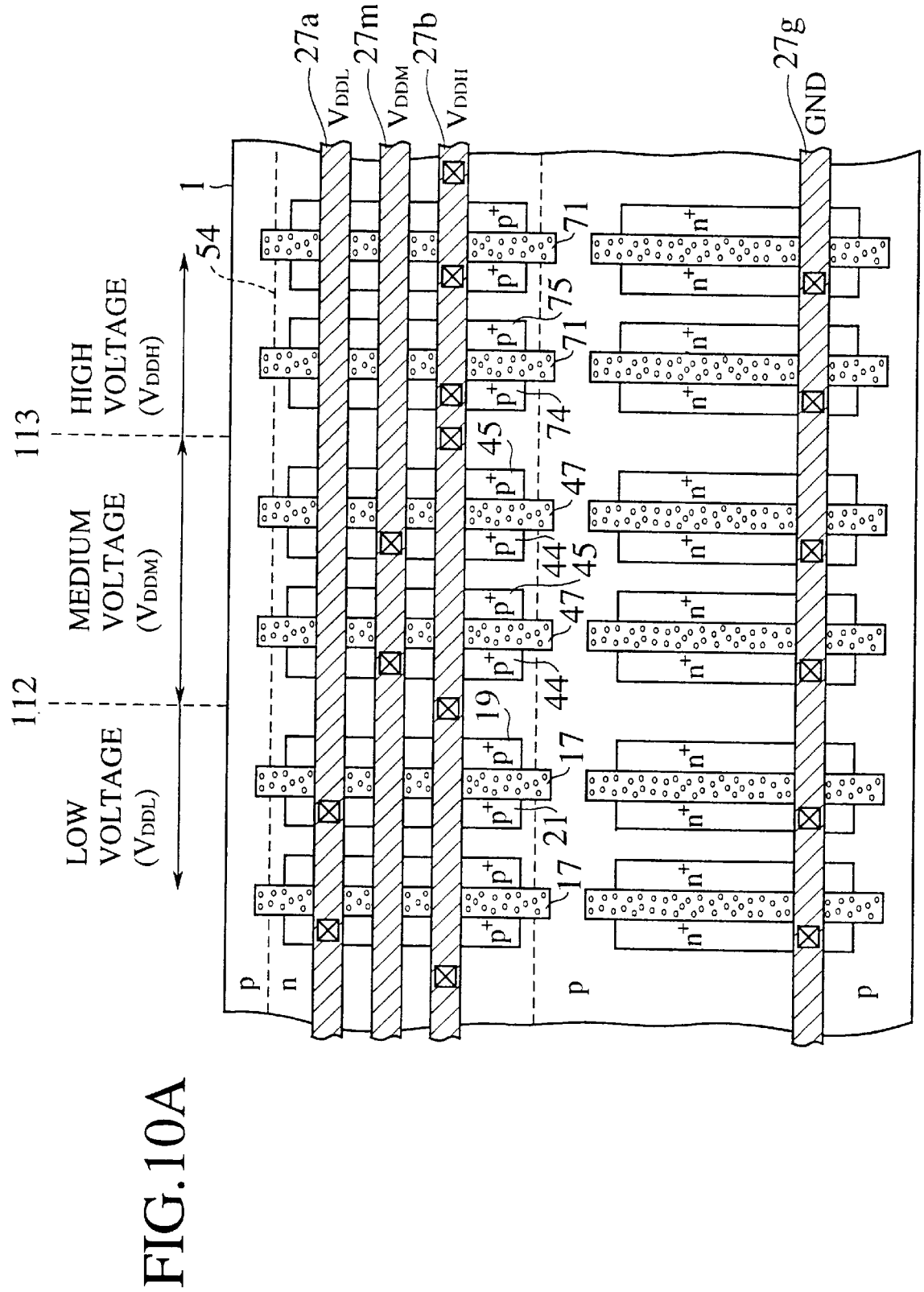
FIG. 10A is a plan view showing a part of a three-power supply integrated circuit according to a fifth embodiment of the present invention.

In the above-mentioned first to fourth embodiments, the case has been explained where two supply voltages are employed. However, the supply voltages are not restricted to two in number in the present invention and therefore the present invention is true similarly of the multi-power supply integrated circuit employing another number of multiple power supply voltages. Hence, as shown in FIG. 10A, in the case of three supply voltages ($V_{DDL}$, $V_{DDM}$, $V_{DDH}$), the highermost power supply voltage ($V_{DDH}$) may be supplied to a common n-well 54 via the high voltage power supply line 27b. For example, a combination of three supply voltages such as $V_{DDL}$=1.5 V, $V_{DDM}$=2.0 V, $V_{DDH}$=3.3 V; $V_{DDL}$=1.9 V, $V_{DDM}$=3.3 V, $V_{DDH}$=5 V; or the like may be employed.

Figure 10B:
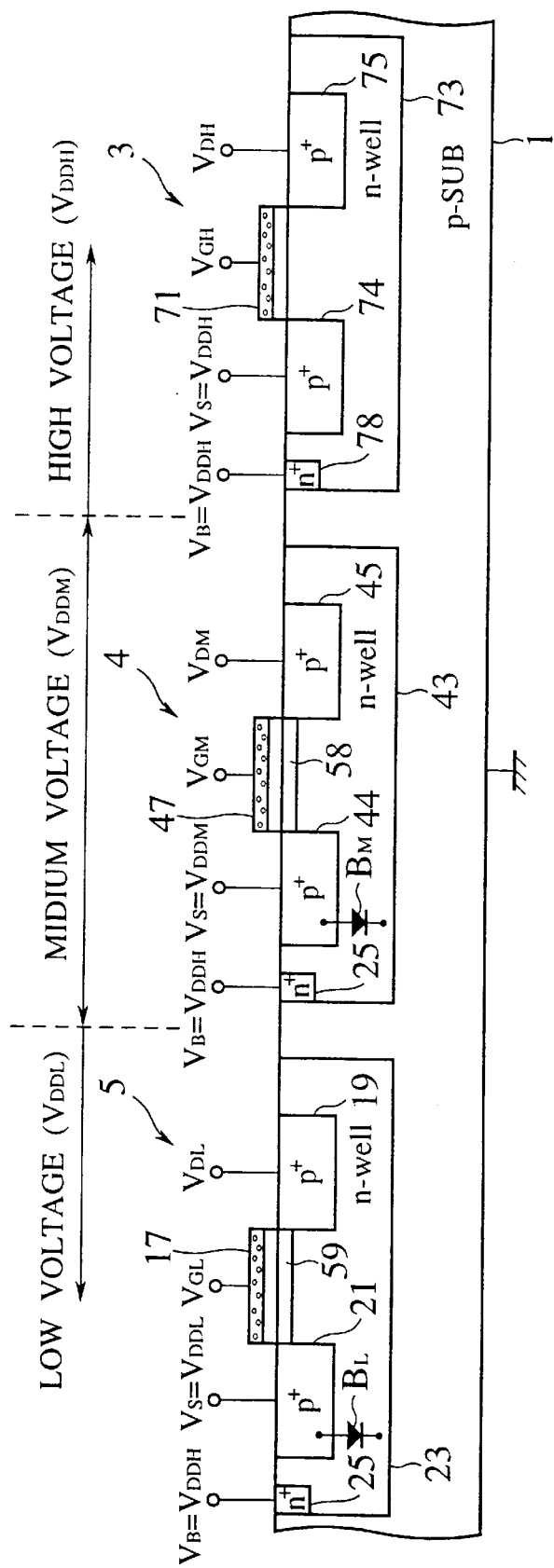
FIG. 10B is a sectional view showing a three-power supply integrated circuit according to a modification of the fifth embodiment of the present invention.

In other words, the fifth embodiment of the present invention corresponds to the case where three supply voltages are supplied to three pMOSs. The n-well may be formed of the common n-well 54 as shown in FIG. 10A, or three independent n-wells 73, 43, 23 as shown in FIG. 10B. In this case, because a diode $B_M$ which is formed between the $p^+$ source region 44 and the n-well 43 of the pMOS 4 and a diode $B_L$ which is formed between the $p^+$ source region 21 and the n-well 23 of the pMOS 5 are backward-biased respectively, no disadvantage is caused at all in operation of the pMOSs 4, 5. In FIG. 10B, in order to compensate a variation of the gate threshold voltage $V_{th}$ due to the substrate bias effect, which corresponds to these backward biases, p type impurity such as boron ($^{11}B^+$) is implanted into channel regions 58, 59 to thus adjust the gate threshold voltage variation. It is of course that preferably gate lengths and widths of the pMOSs 4, 5 and gate oxide films may be adjusted for the substrate bias effect.

Figure 10C:
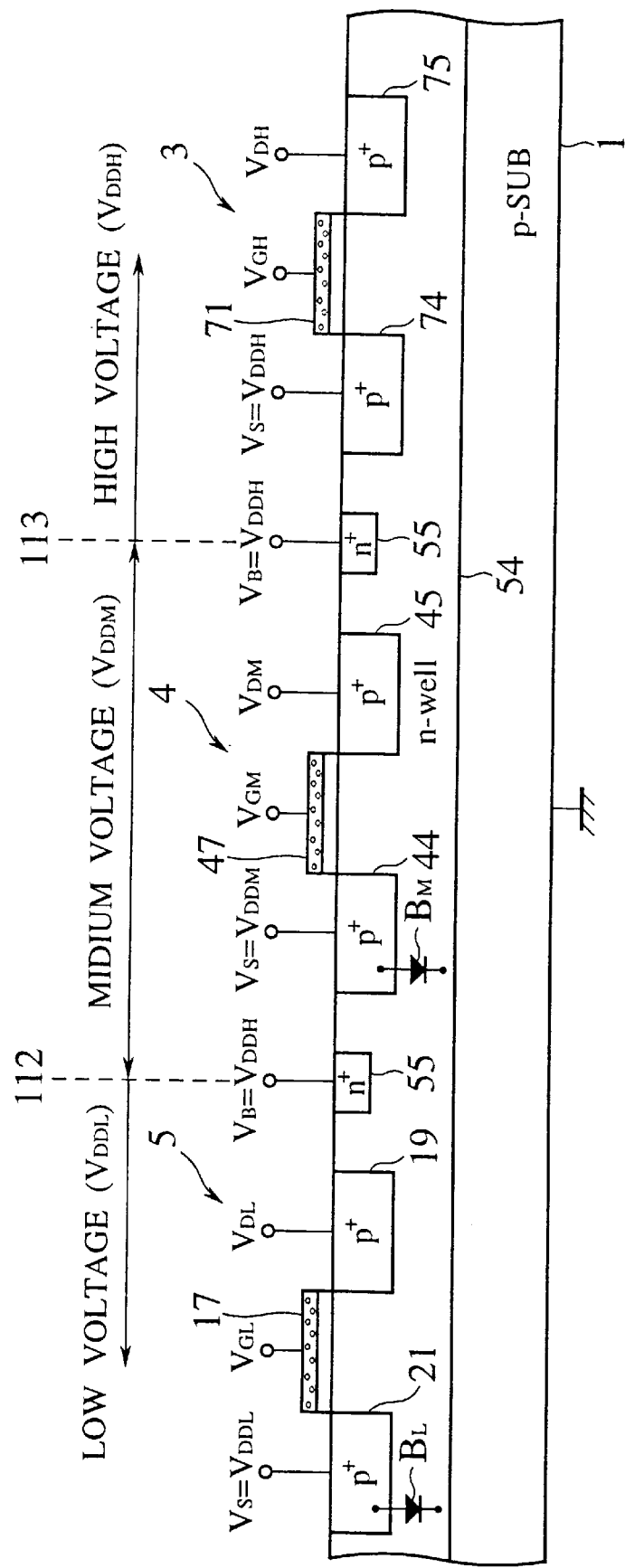
FIG. 10C is a sectional view showing a three-power supply integrated circuit according to another modification of the fifth embodiment of the present invention.
Figure 10D:
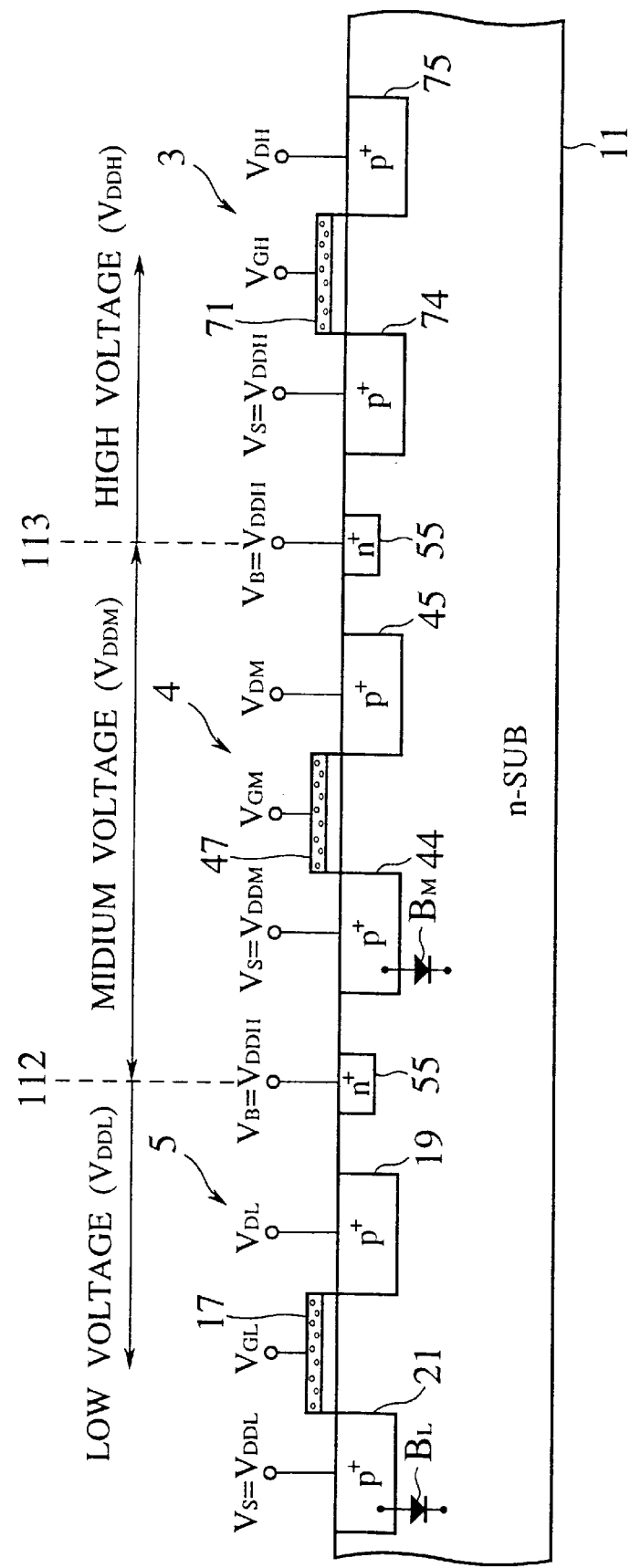
FIG. 10D is a sectional view showing a three-power supply integrated circuit according to still another modification of the fifth embodiment of the present invention.

FIG. 10C is a sectional view showing a multi-power supply integrated circuit including at least three pMOSs 3, 4, 5 which are operated by applying three supply voltages $V_{DDH}$, $V_{DDM}$, $V_{DDL}$ to $p^+$ source regions 74, 44, 21 formed in the common n-well 54 respectively. The high supply voltages $V_{DDH}$ are applied to the common n-well 54 via $n^+$ contact regions 55 provided in the common n-well 54. FIG. 10D shows the case where the pMOS transistors 3, 4, 5 are formed in the n substrate 11. In FIGS. 10C and 10D, a degradation of the speed-performance of the pMOSs can also be avoided if the substrate bias effect due to a potential difference between $V_{DDH}$ and $V_{DDM}$ and a potential difference between $V_{DDM}$ and $V_{DDL}$ is adjusted by controlling dose of channel doping by ion implantation, thicknesses of oxide films, lengths of gates, and widths of gates.

Figure 11A:
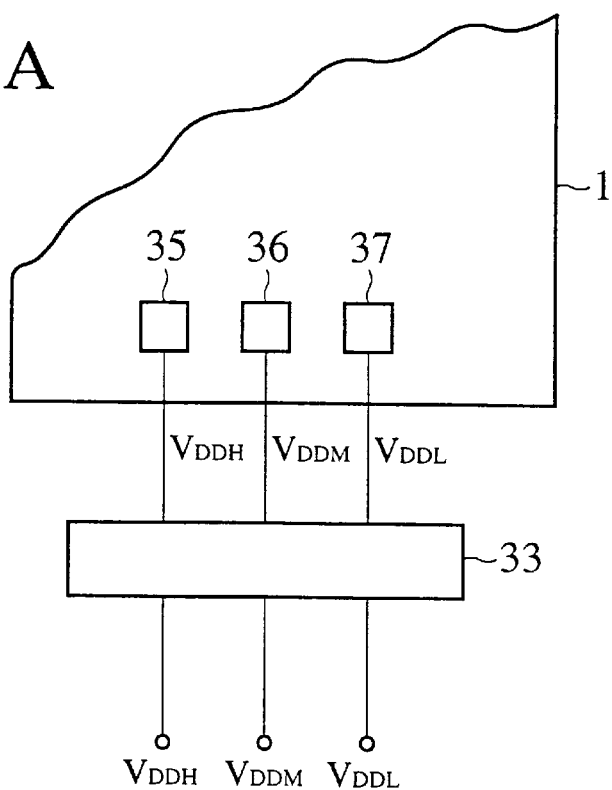
FIG. 11A is a plan view showing a three-power supply integrated circuit according to yet still another modification of the fifth embodiment of the present invention.
Figure 11B:
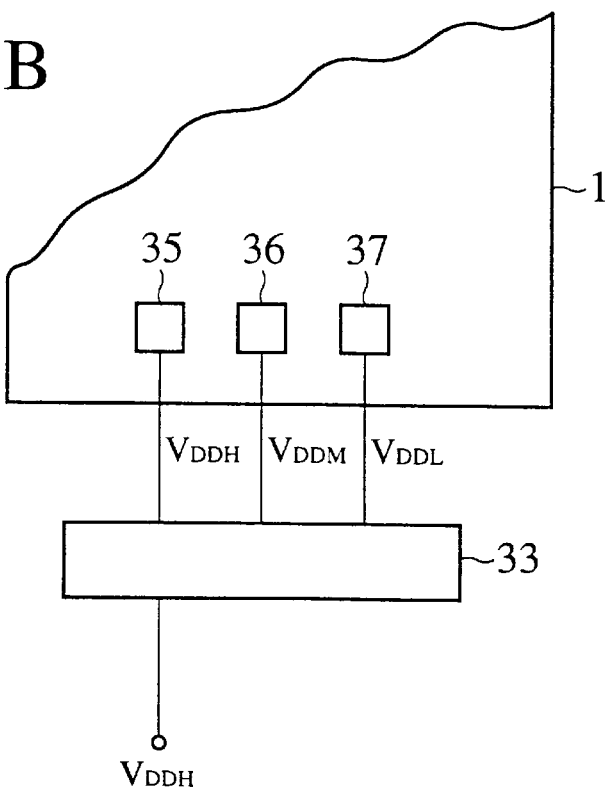
FIG. 11B is a plan view showing a three-power supply integrated circuit according to further modification of the fifth embodiment of the present invention.
Figure 11C:
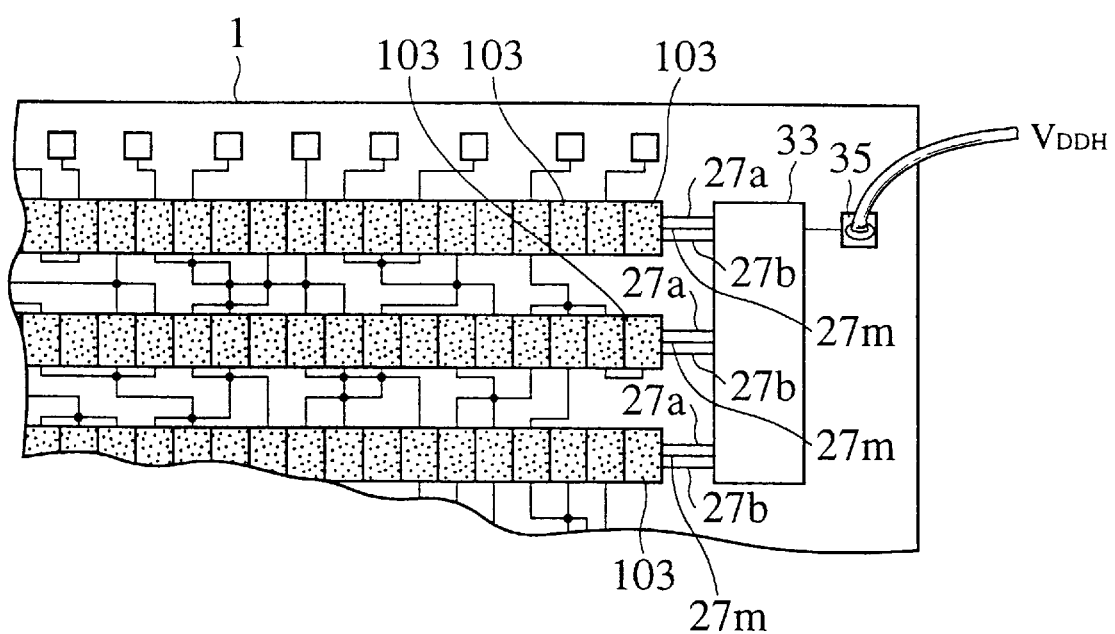
FIG. 11C is a plan-view showing a three power supply integrated circuit according to still further modification of the fifth embodiment of the present invention.

FIGS. 11A and 11B are plan views showing circuit systems including supply voltage control circuits 33 to control application sequences of the power supply voltages $V_{DDH}$, $V_{DDM}$, $V_{DDL}$ which are supplied to the high, middle, low voltage pMOS transistors. The high supply voltage ($V_{DDH}$) is always first applied to a high supply voltage pad 35, and then other supply voltages are applied to a middle supply voltage pad 36 and a low supply voltage pad 37 provided on the semiconductor chip 1 not to cause the forward bias across the diodes $B_M$, $B_L$ shown in FIGS. 10B to 10D. FIG. 11A shows the case where three supply voltages $V_{DDH}$, $V_{DDM}$, $V_{DDL}$ are input into the supply voltage control circuit 33. However, in case the application sequence of three supply voltages $V_{DDH}$, $V_{DDM}$, $V_{DDL}$ is controlled by the DC—DC converter, etc., only the high supply voltage $V_{DDH}$ may be input to the supply voltage control circuit 33, as shown in FIG. 11B, and then the middle and low supply voltages $V_{DDM}$, $V_{DDL}$ may be generated in the DC—DC converter, etc. by making use of the high supply voltage $V_{DDH}$. In addition, as shown in FIG. 11C, the supply voltage control circuit 33 may be mounted on the same semiconductor chip 1.

Sixth Embodiment

In the above explanation, the present invention has been explained while taking the PMOS transistors in CMOS configurations as examples. However, the present invention may be similarly applied to nMOS transistors in CMOS integrated circuits.

Figure 12A:
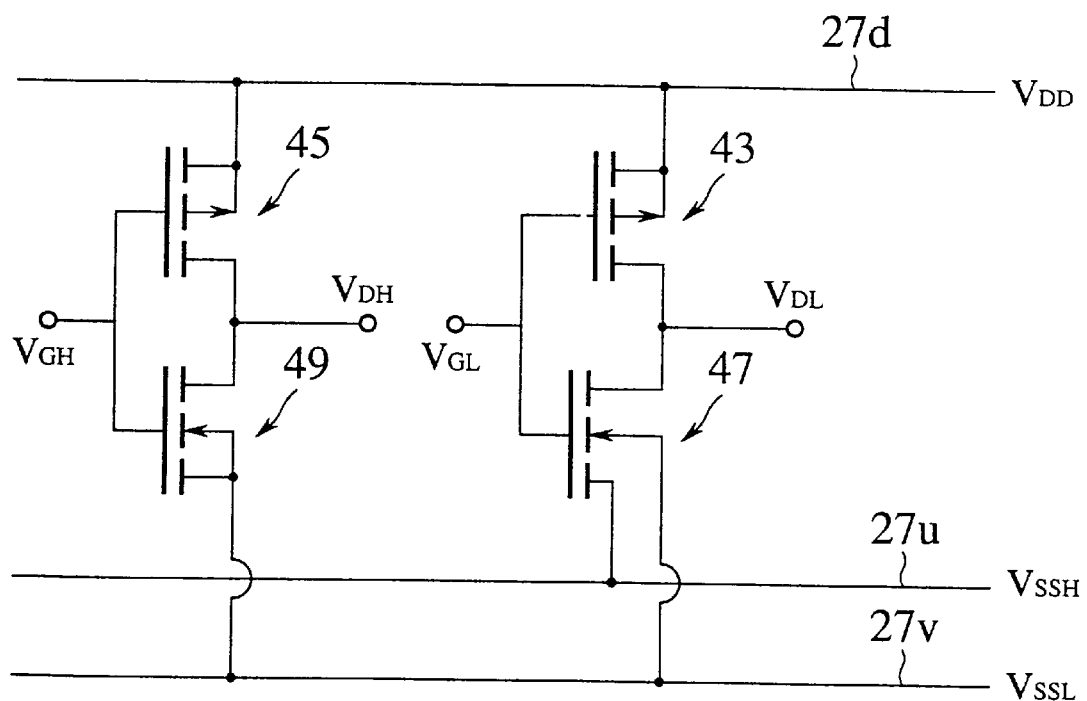
FIG. 12A is an equivalent circuit diagram showing a CMOS multi-power supply integrated circuit having nMOS operating at different supply voltages according to a sixth embodiment of the present invention.
Figure 12B:
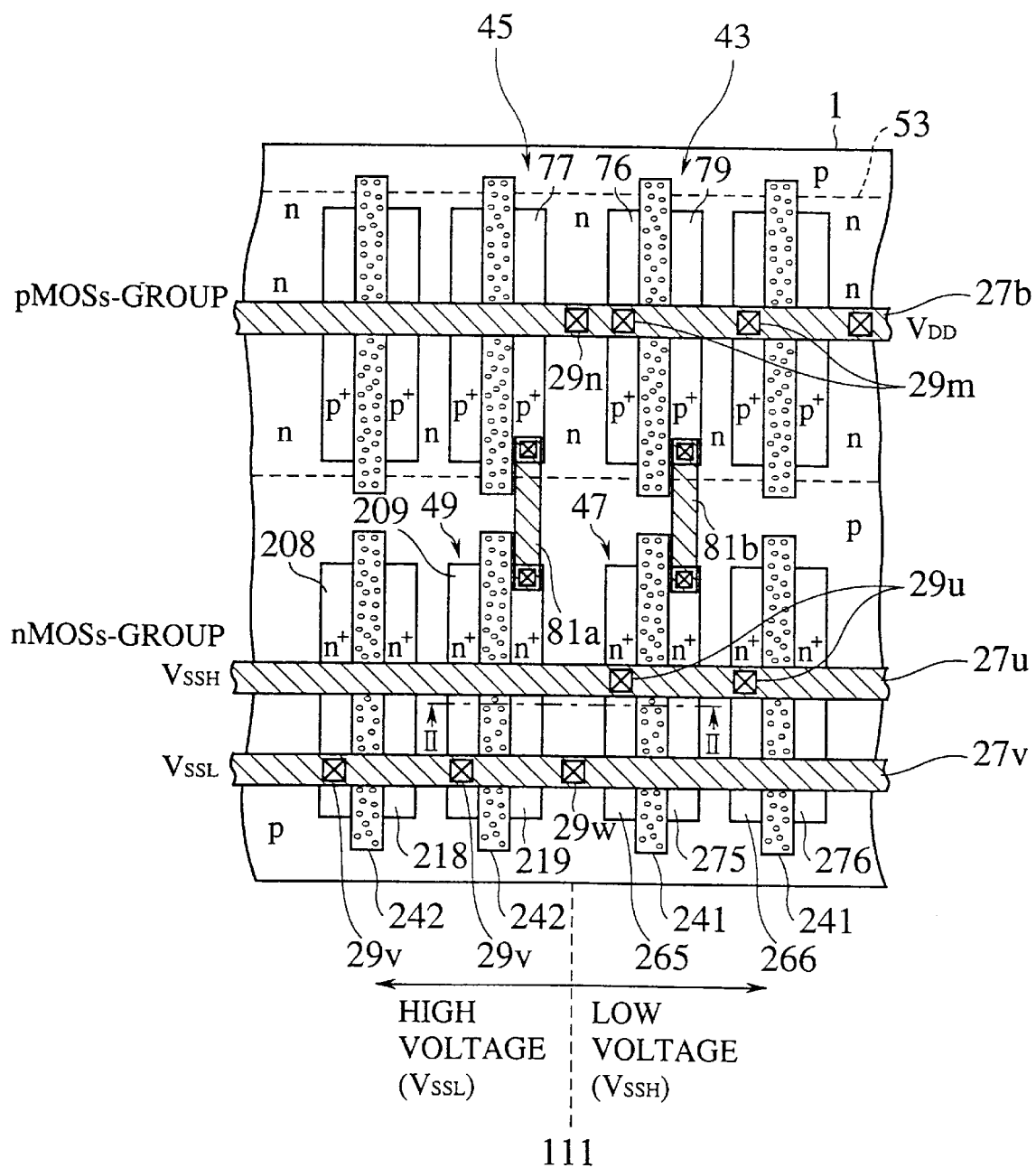
FIG. 12B is a plan view showing the CMOS multi-power supply integrated circuit shown in FIG. 12A.

FIG. 12A is an equivalent circuit diagram showing a part of a CMOS multi-power supply integrated circuit according to a sixth embodiment of the present invention, which is designed according to the gate array design approach. FIG. 12B is a plan view of the CMOS multi-power supply integrated circuit including the CMOSs shown in FIG. 12A. FIG. 12C is a sectional view, taken along a II—II direction in FIG. 12B, showing the nMOSs 47, 49 in FIG. 12B. For the sake of simplicity, a circuit employing two supply voltages (i.e., low supply voltage ($V_{SSL}$) serving as a first supply voltage and high supply voltage ($V_{SSH}$)) serving as a second supply voltage will be explained as the multi-power supply integrated circuit. As shown in FIG. 12A, the CMOS multi-power supply integrated circuit according to the present invention is made up of a CMOS consisting of a pMOS 43 and an nMOS 47, which constitute a low potential basic cell ($V_{SSH}$ cell) operated at the high supply voltage ($V_{SSH}$), and another CMOS consisting of a pMOS 45 and an nMOS 49, which constitute a high potential basic cell ($V_{SSL}$ cell) operated at the low supply voltage ($V_{SSL}$). Since the operating voltages of the CMOS are measured from a higher level supply voltage (VDD), the cell applied with the high supply voltage ($V_{SSH}$) is called as "the low potential basic cell". Similarly, the cell applied with the low supply voltage ($V_{SSL}$) is called as "the high potential basic cell", because the potential difference $V_{DD}$-$V_{SSL}$ is higher than that of $V_{DD}$-$V_{SSH}$. As shown in FIG. 12B, the high potential basic cell and the low potential basic cell are placed adjacently to put a boundary line 111 therebetween. A low voltage power supply line 27v for supplying the low supply voltage ($V_{SSL}$) and a high voltage power supply line 27u for supplying the high supply voltage ($V_{SSH}$) are formed at a predetermined distance to cross over the high potential basic cell and the low potential basic cell. An p⁺ contact region 235 is formed in a p substrate 1 to apply the first supply voltage to the p substrate 1. The first nMOS 49 comprises the polysilicon gate electrode 242, the n⁺ drain region 219, and the n⁺ source region 209. Similarly, the second nMOS 47 comprises the polysilicon gate electrode 241, the n⁺ drain region 275, and the n⁺ source region 265.

As shown in FIG. 12B, the first supply voltage can be applied to a p substrate 1 through the $V_{SSL}$ power supply line 27v connected to a contact hole 29w. The contact hole 27w is provided in an interlayer insulating film. The contact hole 29w is formed on the n⁺ contact region at the top of the p substrate 1. A p⁺ drain region 79 of the pMOS 43 is connected to an n⁺ drain region 275 of the nMOS 47 via a signal line 81b. A p⁺ drain region 77 of the pMOS 45 is connected to an n⁺ drain region 219 of the nMOS 49 via a signal line 81a.

In the sixth embodiment of the present invention, since both the first nMOS 49 disposed in the high potential basic cell and the second nMOS 47 disposed in the low potential basic cell are formed in the common p substrate 1 and the low supply voltage ($V_{SSL}$) is supplied to the p substrate 1, the problem of carrier injection between the high and low potential basic cells does not arise inherently. Therefore the reduction in the chip size of the integrated circuit can be attained by placing more closely the high and low potential basic cells.

In the sixth embodiment of the present invention, in the first nMOS 49 constituting the high potential basic cell, a potential distribution in respective portions are the same as those in the ordinary nMOS since the low supply voltage ($V_{SSL}$) equal to the source voltage is applied to the p substrate 1. In the second nMOS 47 constituting the low potential basic cell, a potential difference appears between the n⁺ source region 265 and the p substrate since not the high supply voltage ($V_{SSH}$) serving as the source voltage, but the low supply voltage ($V_{SSL}$) is applied to the p substrate 1. Nevertheless, since this potential difference acts as backward bias against a diode $B_n$ formed between the n⁺ source region 265 and the p substrate 1, no current flows between the n⁺ source region 265 and the p substrate 1 due to this potential difference and therefore the operation of the second nMOS 47 is never degraded.

Figure 13:
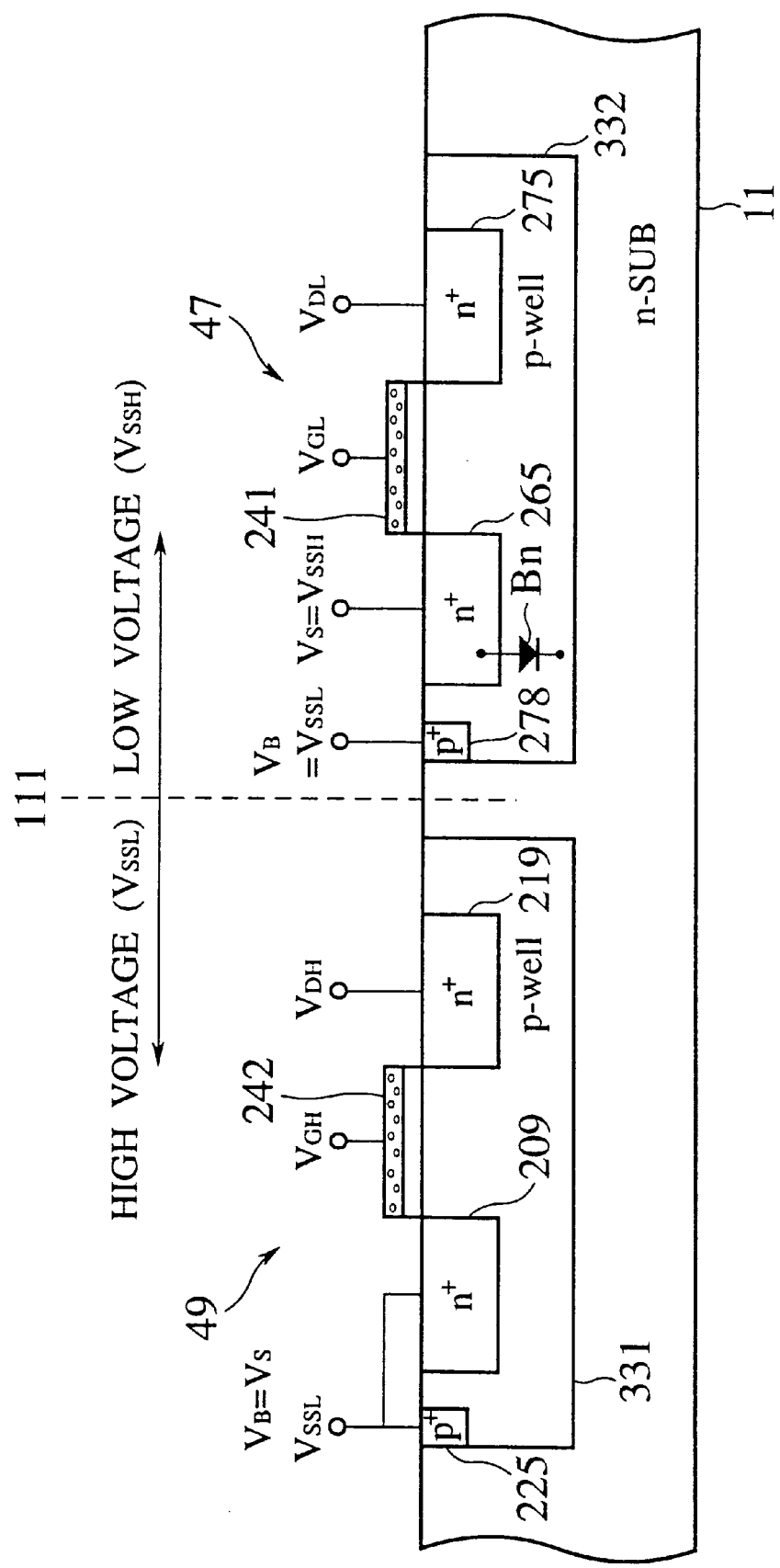
FIG. 13 is a sectional view showing a CMOS multi-power supply integrated circuit according to a modification of the sixth embodiment of the present invention.

FIG. 13 shows a sectional view of nMOSs in CMOS multi-power supply integrated circuit according to a modification of the sixth embodiment of the present invention. In FIG. 13, a first nMOS 49 whose n⁺ source region 209 is applied with a low supply voltage (a first supply voltage: $V_{SSL}$) is disposed in a first p-well (p semiconductor region) 331. And a second nMOS 47 whose n⁺ source region 265 is applied with a high supply voltage (a second supply voltage $V_{SSH}$) is disposed in a second p-well (p semiconductor region) 332.

In FIG. 13, since the low supply voltage ($V_{SSL}$) is supplied to both the first p-well 331 of the first nMOS 49 serving as the high potential basic cell and the second p-well 332 of the second nMOS 47 serving as the low potential basic cell, two p-wells 331, 332 are set at the same potential. That is, since there is no potential difference between two p-wells 331, 332, carrier injection between the p-wells 331, 332 can be suppressed without requiring a high resistance between the adjacent p-wells. Hence, both the p-wells 331, 332 can be placed in close vicinity to each other to thereby yield reduction in the chip area because there is no necessity of separating the high potential basic cell from the low potential basic cell at a certain interval.

In FIG. 13, the low supply voltage ($V_{SSL}$) is applied to the n+ source region 209 in the first nMOS 49 constituting the high potential basic cell, which is similar to the bias configuration of the conventional nMOS circuitry. In contrast, not the high supply voltage ($V_{SSH}$) which is to be supplied in a conventional circuit, but the low supply voltage ($V_{SSL}$) is applied to the second p-well 332 having the second nMOS 47 constituting the low potential basic cell. Hence, a potential difference appears between the n+ source region 265 and the second p-well 332. However, since this potential difference acts as backward bias against a diode $B_n$ formed between the n+ source region 265 and the second p-well 332. Then, no current is induced between the n+ source region 265 and the second p-well 332 because of such potential difference. Consequently, the performance of the second nMOS 47 is in no way degraded. As has explained above, the present invention is characterized in that the same low supply voltage is employed as the first supply voltages being supplied to respective p-wells (p semiconductor regions) located on the high and low potential sides. Therefore, such p-wells (p semiconductor regions) located on the high and low potential sides are mutually contacted to form a single common p-well (common p semiconductor region).

Figure 14A:
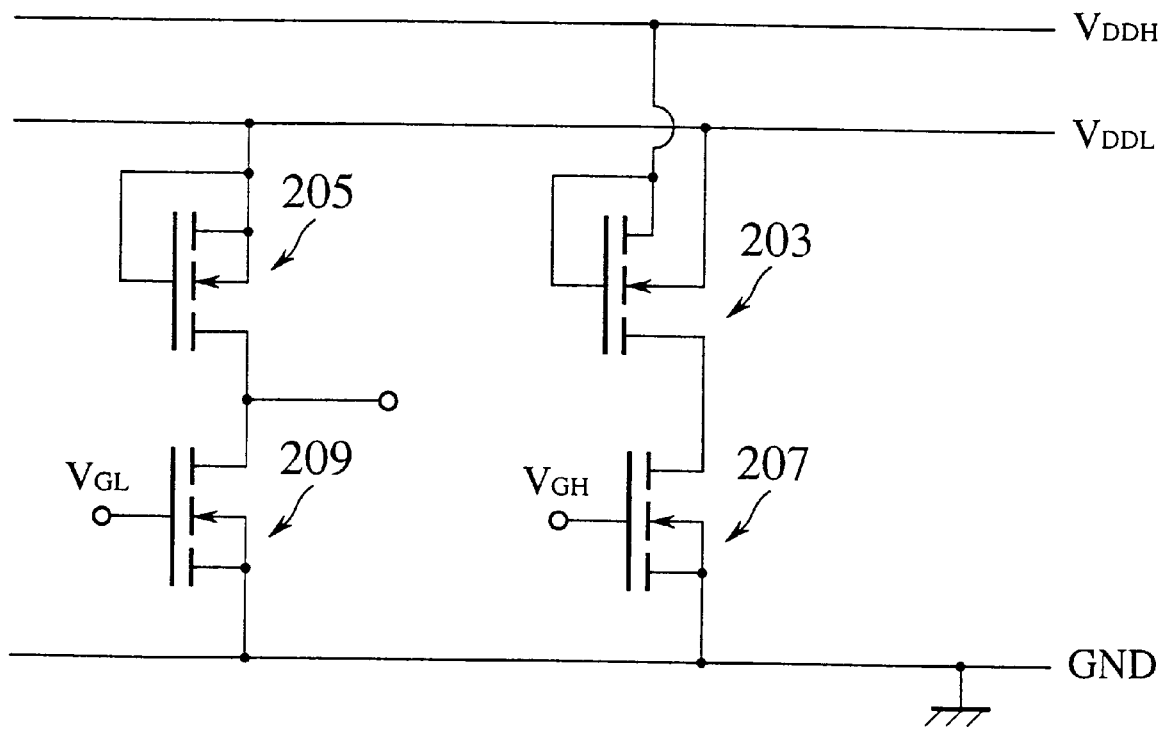
FIG. 14A is an equivalent circuit diagram showing a part of an nMOS multi-power supply integrated circuit having an enhancement/enhancement (E/E) configuration according to another modification of the sixth embodiment of the present invention.
Figure 14B:
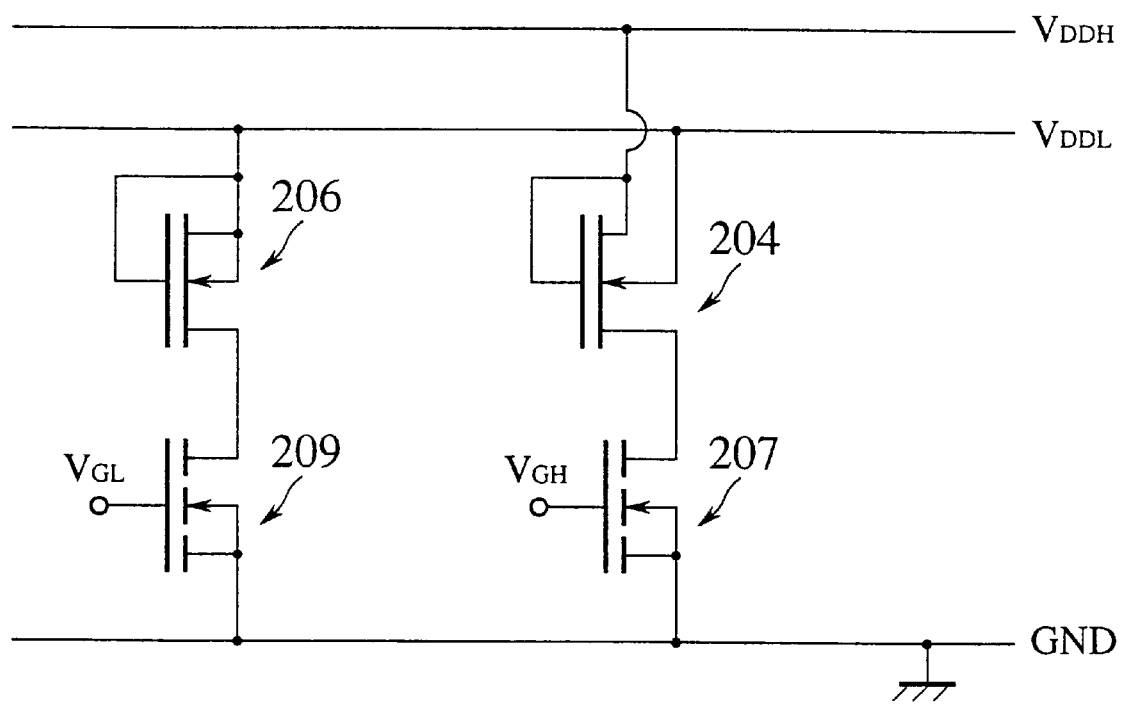
FIG. 14B is an equivalent circuit diagram showing a part of an nMOS multi-power supply integrated circuit having an enhancement/depletion (E/D) configuration according to still another modification of the sixth embodiment the present invention.

In the above explanation, the present invention has been explained while taking the CMOS circuit as examples. However, the application of the present invention is not limited to the CMOS configuration, but may be similarly applied to nMOS logics. FIG. 14A shows an nMOS multi-power supply integrated circuit having an enhancement/enhancement (E/E) configuration wherein a high potential basic cell consisting of an enhancement type (abbreviated as "E type" hereinafter) nMOS 203 and an E type nMOS 207 and a low potential basic cell consisting of an E type nMOS 205 and an E type nMOS 209 are placed adjacently as another modification of the sixth embodiment. Gate electrodes of the E type nMOSs 203, 205 are directly coupled to the source regions. FIG. 14B shows still another modification of the sixth embodiment, in which an nMOS multi-power supply integrated circuit having an enhancement/depletion (E/D) configuration wherein a high potential basic cell consisting of a depletion type (abbreviated as "D type" hereinafter) nMOS 204 and the E type nMOS 207 and a low potential basic cell consisting of a D type nMOS 206 and the E type nMOS 209 are placed adjacently is shown.

FIG. 15 is a sectional view showing only the E type nMOS 203 and the E type nMOS 205 which are transistors formed on the load side of the E/E configuration shown in FIG. 14A. As shown in the sectional view of FIG. 15, the second E type nMOS 203 comprises a polysilicon gate electrode 241 serving as a gate, an n+ diffusion layer 231 serving as a drain region, and an n+ diffusion layer 232 serving as a source region. Similarly, the first E type nMOS 205 comprises a polysilicon gate electrode 242 serving as a gate, an n+ diffusion layer 233 serving as a drain region, and an n+ diffusion layer 234 serving as a source region. Both the first E type nMOS 205 and the second E type nMOS 203 are formed in a common well 212. The low supply voltage ($V_{DDL}$) serving as the first supply voltage is applied to a p+ contact region 235 formed in a p-well 212.

In FIG. 15, since the low supply voltage ($V_{DDL}$) is applied to the n+ source region 234 in the first E type nMOS 205 of the low potential basic cell, the ordinary nMOS bias in a conventional circuit can be applied similarly. In contrast, not the high supply voltage ($V_{DDH}$), or the second supply voltage, known in the art, but the low supply voltage ($V_{DDL}$) is applied to the p-well 212 in the E type nMOS 203 of the high potential basic cell. Hence, a potential difference appears between the n+ source region 232 and the p-well 212. Nevertheless, since this potential difference acts as backward bias against a diode (pn junction) $B_n$ formed between the n+ source region 232 and the p-well 212, no current flows between the n+ source region 232 and the p-well 212 due to this backward bias. Consequently, this potential difference exerts no influence upon the second E type nMOS 203. Although the E type nMOSs 203, 205 are formed in the p-well 212 provided in the semiconductor substrate 211 in FIG. 13, similarly a p substrate may be used instead of the p-well 212, as in the second embodiment. Similarly the first and second E type nMOSs 205, 203 may be formed in individual first and second p-wells (p semiconductor region) respectively, like the first embodiment.

The substrate bias effect which occurs in the second nMOS 47, 203 correspondingly to the potential difference $V_{DDH}-V_{DDL}$ may be canceled by adjusting the threshold voltage in terms of control of dose of channel doping of ion implantation, lengths of gate, etc., like the third embodiment. Further, as in the fifth embodiment, three nMOSs being operated by three supply voltages ($V_{DDL}$, $V_{DDM}$, $V_{DDH}$) respectively may be placed adjacently. Still further, as has been discussed in the fourth embodiment, if the circuit system is employed wherein the supply voltage control circuit for controlling the application sequence of the supply voltages ($V_{DDH}$, $V_{DDL}$) or ($V_{DDH}$, $V_{DDM}$, $V_{DDL}$) is mounted on the same chip or on the outside of the chip, the system design can be made easier.

Figure 2A:
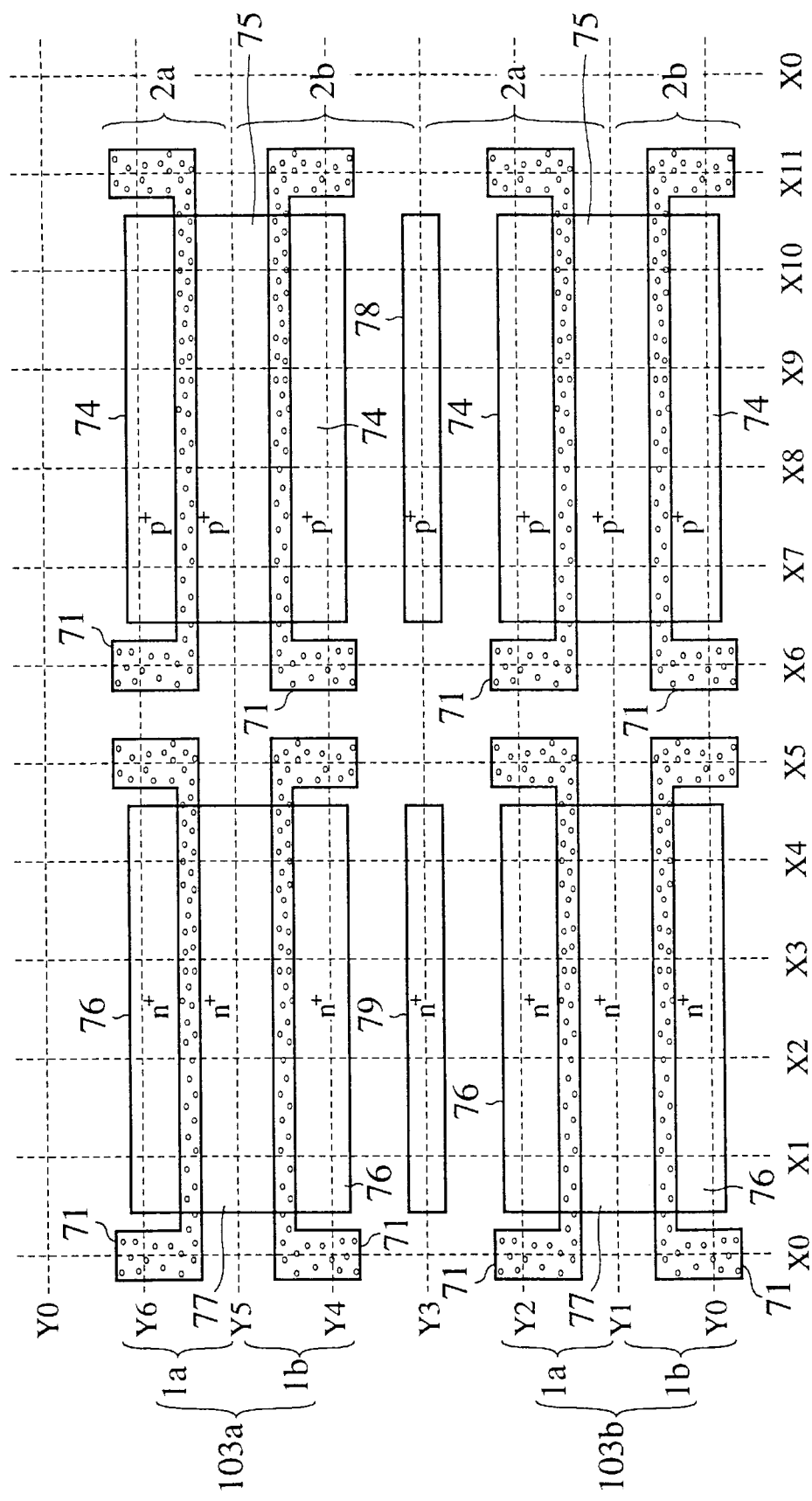
FIG. 2A is a plan view showing an example of basic cells constituting the gate array shown in FIG. 1.
Figure 2B:
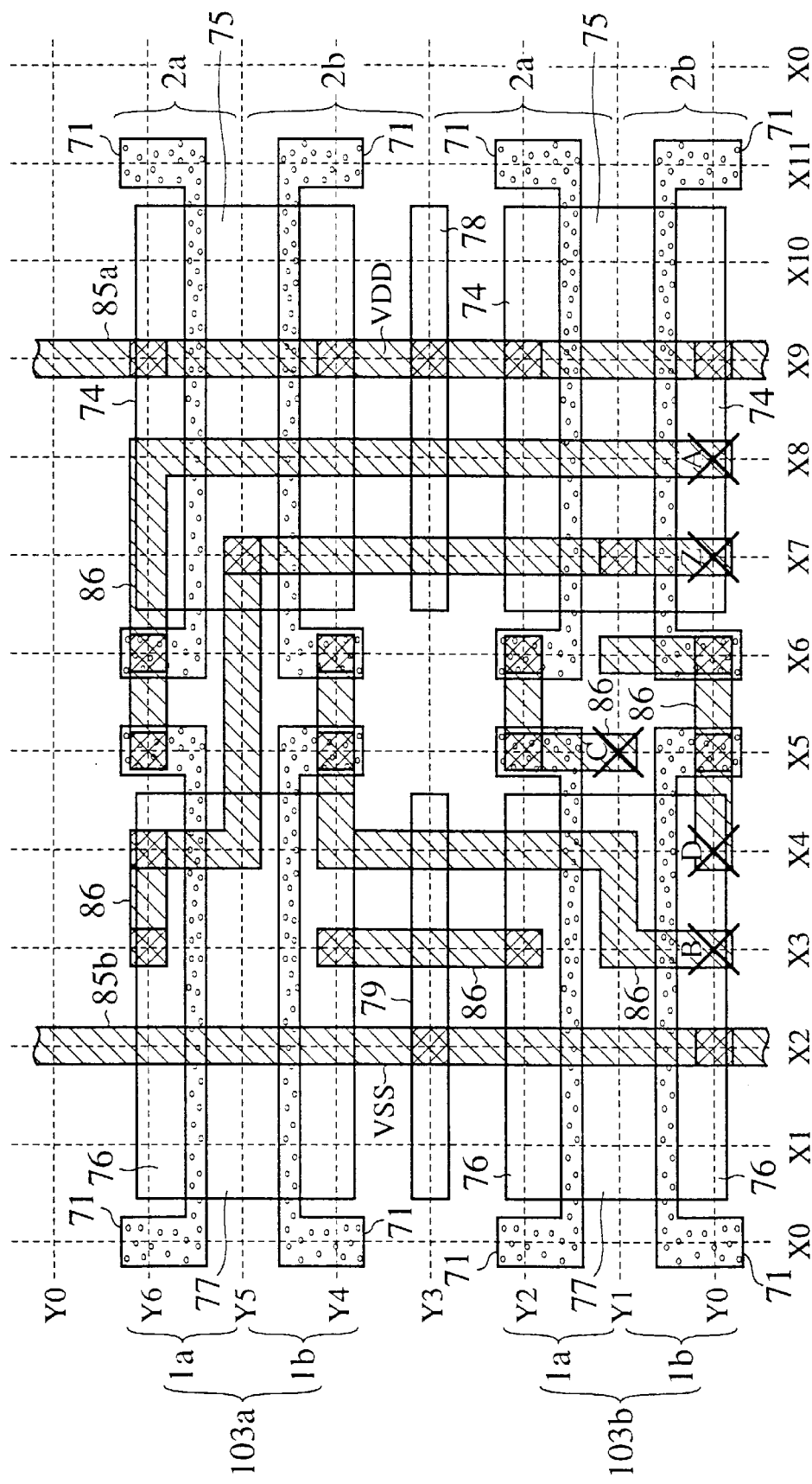
FIG. 2B is a plan view showing a logic functional block which is constituted by disposing metal wirings on the basic cell shown FIG. 2A.
Figure 2C:
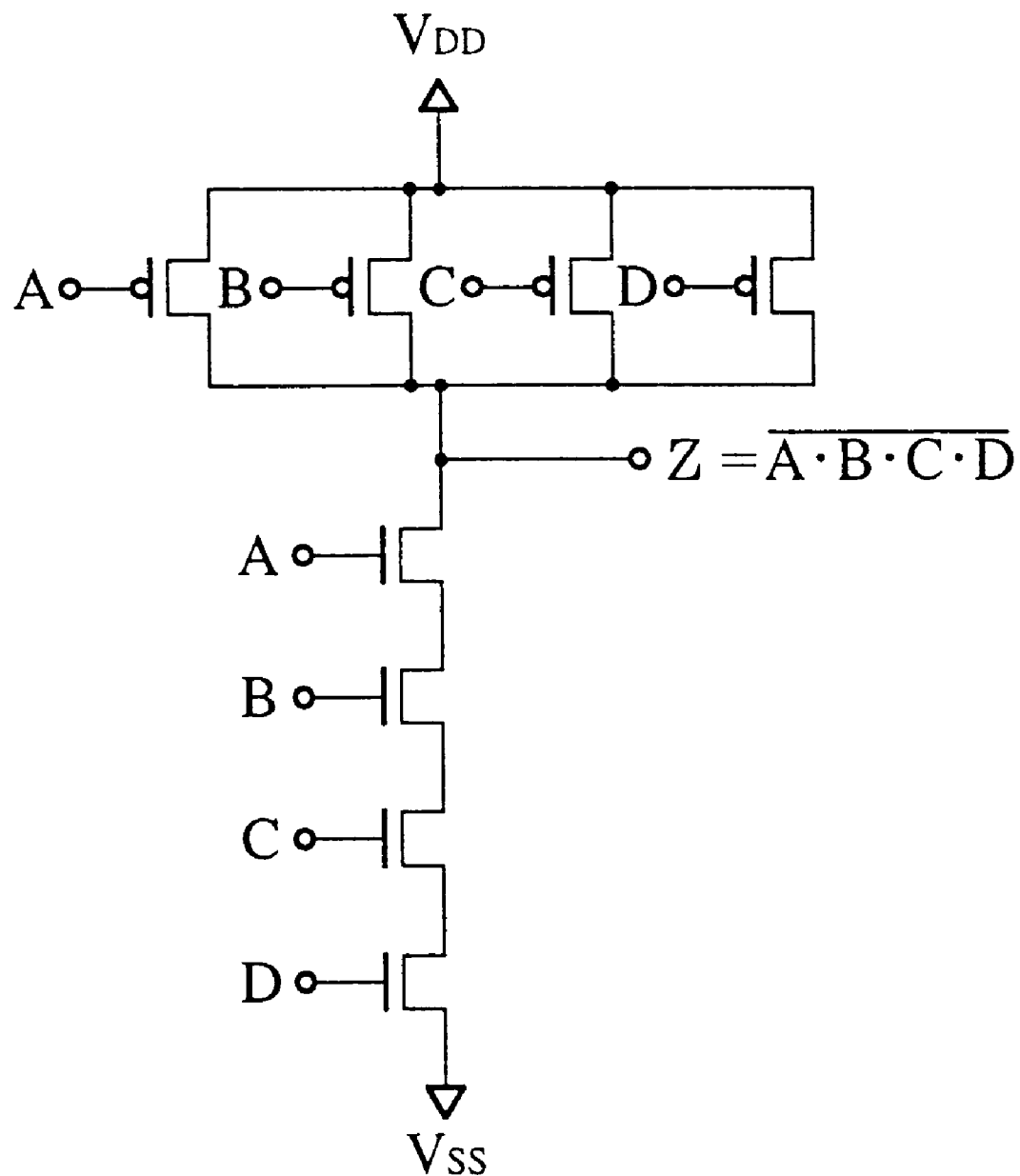
FIG. 2C is an equivalent circuit diagram showing a four-input NAND circuit serving as the logic functional block shown in FIG. 2B.
Figure 16:
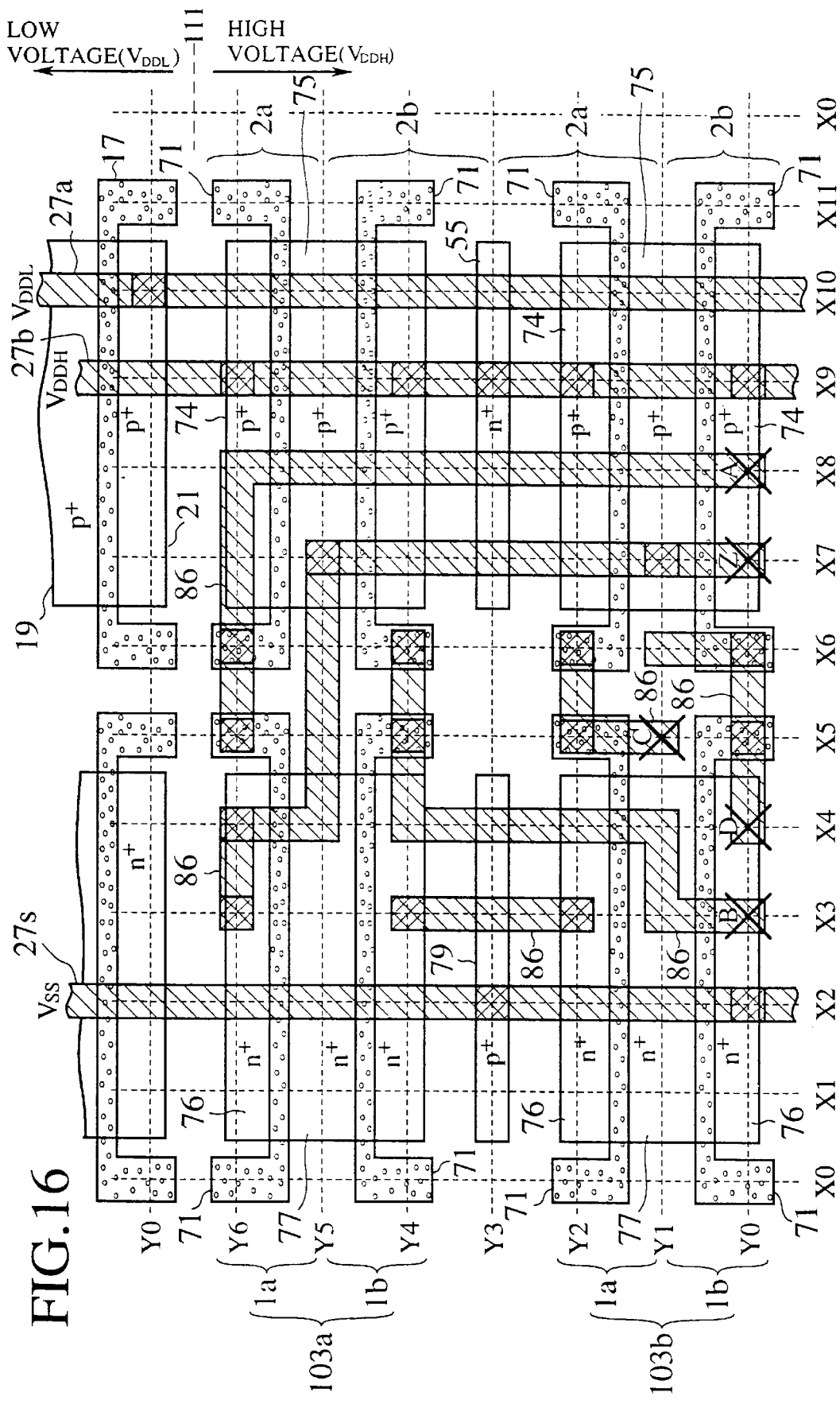
FIG. 16 is a plan view showing a logic functional block in a gate array according to another embodiment of the present invention.

Various modifications will become possible for those skilled in the art after receiving the teachings of the present disclosure without departing from the scope thereof. For example, FIG. 16 shows layout pattern of the metal wirings of four-input NAND circuit in a gate array as another embodiment of the present invention. The four-input NAND gate of the present invention employs four input terminals A, B, C, and D. Namely, four end portions of the metal wirings (signal wirings) corresponding to perpendicular lines X8, X3, X5, X4 represent input terminals A, B, C, D, respectively. The input terminal A is connected to a gate polysilicon regions 71 of an n-MOS 1a and a p-MOS 2a constituting a high potential basic cell 103a. The input terminal B is connected to the gate polysilicon regions 71 of an n-MOS 1b and a p-MOS 2b constituting the high potential basic cell 103a. The input terminal C is connected to the gate polysilicon regions 71 of the n-MOS 1a and the p-MOS 2a constituting the high potential basic cell 103b. The input terminal D is connected to the gate polysilicon regions 71 of the n-MOS 1b and the p-MOS 2b constituting the high potential basic cell 103b. A high voltage ($V_{DDH}$) power supply line 27b is provided along the line X9 to be connected to a source region 74 of the p-MOSs 2a, 2b in a common n-well and to an n+ contact region 55 formed in a common n-well, so that four p-MOS are connected in parallel. In the common n-well, the high potential basic cells 103a, 103b and a low potential basic cell ($V_{DDL}$ cell) neighboring to the high potential basic cell 103a are formed to put a boundary line 111 therebetween. A low voltage ($V_{DDL}$) power supply line 27a is provided along the line X10 to supply a source voltage to p+ source region 21 of a pMOS in the low potential basic cell ($V_{DDL}$ cell). A lower voltage (VSS) power supply line 27s is provided along the line X2 and connected to a source region 76 of the n-MOS 1b in a p-well and p+ contact region 79. An end portion of the signal wiring along the X7 serves as an output terminal Z. The output terminal Z is in turn connected to respective drain regions 75 of four p-MOSs 2a, 2b and the source region 76 of one n-MOS 1a. Four n-MOSs 1a, 1b are connected in serial with each other by virtue of a wiring 86 provided along the line X3. An equivalent circuit of the four-input NAND gate shown in FIG. 14 is same as shown in FIG. 2C. Input terminals A, B, C, D are connected by predetermined interconnections to the functional block in the preceding stage, and the output terminal Z is connected by a predetermined interconnection to the functional block in the succeeding stage. In addition, the high voltage ($V_{DDH}$) power supply line 27b, the low voltage ($V_{DDS}$) power supply line 27a and the lower voltage power supply line 27s are extended as common power supply lines (supply rails) over other functional blocks in a gate array (though not shown). Since the high potential basic cell and the low potential basic cell are formed in a common n-well, the cell arrays can be scaled down along the vertical direction in FIG. 16.

Although the multi-power supply integrated circuit employing three kinds of supply voltages has been explained in the fifth embodiment, a multi-power supply integrated circuit employing more than four kinds of supply voltages may be employed. In addition, the n-well in p substrate structure and the n substrate structure have been explained in the above-mentioned first to fifth embodiments, but it would be easily understood for the person skilled in the art that the present invention is similarly true of a p-well in n substrate structure and a twin well structure. Although the nMOSs in CMOS configuration and nMOS logics having the E/E configuration and the E/D configuration have been explained in the sixth embodiment, the present invention may of course be applied to logic gates composed of nMOSs other than the above configurations and logic gates further including pMOSs.

What is claimed is:

1. A CMOS integrated circuit having a first high level power supply line to supply a first constant supply voltage, a second high level power supply line to supply a second constant supply voltage lower than the first constant supply voltage and a low level power supply line to supply a constant voltage lower than the second constant supply voltage the circuit comprising:
    a) a first n-well connected to the first high level power supply line:
    b) a second n-well placed at a closest location to the first n-well and connected to the first high level power supply line;
    c) a first pMOS transistor formed in the first n-well and has a p+ source region connected to the first high level power supply line;
    d) a second pMOS transistor formed in the second n-well and has a p+ source region connected to the second high level power supply line;
    e) a first nMOS transistor having a n+ source region connected to the low level power supply line an n+ drain region being connected to a p+ drain region of the first PMOS transistor; and
    f) a second NMOS transistor having an n+ drain region being connected to a p+ drain region of the second PMOS transistor.

2. The integrated circuit of claim 1, further comprising:
    a first n$^+$ contact region formed in the first n-well; and
    a second n$^+$ contact region formed in the second n-well.

3. The integrated circuit of claim 2, wherein the first supply voltage is applied to the first and second n-wells via the first and second n$^+$ contact regions respectively.

4. The integrated circuit of claim 1, wherein the first and second n-wells are brought into contact to each other to form a common n-well.

5. The integrated circuit of claim 4, further comprising an n$^+$ contact region formed in the common n-well.

6. The integrated circuit of claim 5, wherein the first supply voltage is applied to the common n-well via the n$^+$ contact region.

7. The integrated circuit of claim 1, further comprising:
    a third high level power supply line to supply a third constant supply voltage lower than the first constant supply voltage;
    a third n-well connected to the first high level power supply line;
    a third PMOS transistor formed in the third n-well and has a p+ source region connected to the third high level power supply line; and
    a third NMOS transistor having an n+ source region connected to the low level power supply line an n+ drain region being connected to a p+ drain region of the third PMOS transistor.

8. The integrated circuit of claim 7, wherein the first, second and third n-wells are brought into contact mutually to form a common n-well.

9. The integrated circuit of claim 8, further comprising an n+ contact region formed in the common n-well.

10. The integrated circuit of claim 9, wherein the first constant supply voltage is always applied to the common n-well via the n$^+$ contact region.

11. The integrated circuit of claim 7, wherein the first, second, and third pMOS transistors are such transistors constituting a part of cell arrays which are formed on a semiconductor chip.

12. The integrated circuit of claim 7, wherein the third pMOS transistor is formed to compensate a variation in a threshold voltage caused by a substrate bias effect due to a difference between the first and third supply voltages.

13. The integrated circuit of claim 7, wherein said first NMOS transistor has a gate electrode being connected to a gate electrode of the first PMOS transistor, said second NMOS transistor has a gate electrode being connected to a gate electrode of the second PMOS transistor, the gate electrode of the second NMOS transistor being electrically independent of the gate electrode of the first NMOS transistor and said third NMOS transistor has a gate electrode being connected to a gate electrode of the third PMOS transistor, the gate electrode of the third NMOS transistor being electrically independent of the gate electrode of the first and the second NMOS transistors.

14. The integrated circuit of claim 1, wherein the first and second pMOS transistors are such transistors constituting a part of cell arrays which are formed on a semiconductor chip.

15. The integrated circuit of claim 14, wherein said first and second high level power supply lines and said low level power supply line are aligned along the direction of and on the cell array to cross over basic cells constituting the cell array.

16. The integrated circuit of claim 1, wherein the second pMOS transistor is formed to compensate a variation in a threshold voltage caused by a substrate bias effect due to a difference between the first and second constant supply voltages.

17. The integrated circuit of claim 1, wherein said first NMOS transistor has a gate electrode being connected to a gate electrode of the first PMOS transistor, and said second NMOS transistor has a gate electrode being connected to a gate electrode of the second PMOS transistor, the gate electrode of the second NMOS transistor being electrically independent of the gate electrode of the first NMOS transistor.

18. A CMOS integrated circuit having a first high level power supply line to supply a first constant supply voltage, a second high level power supply line to supply a second constant supply voltage lower than the first constant supply voltage and a low level power supply line to supply a constant voltage lower than the second constant supply voltage; the circuit comprising:
   a) an n substrate connected to the first high level power supply line;
   b) a first PMOS transistor formed in the n substrate and has a p+ source region connected to the first high level power supply line;
   c) a second PMOS transistor formed in the n substrate adjacent to the first PMOS transistor and has a p+ source region connected to the second high level power supply line;
   d) a first NMOS transistor having an n+ source region connected to the low level power supply line, an n+ drain region being connected to a p+ drain region of the first PMOS transistor; and
   e) a second NMOS transistor having an n+ source region connected to the low level power supply line, an n+ drain region being connected to a p+ drain region of the second PMOS transistor.

19. The integrated circuit of claim 18, wherein said first NMOS transistor has a gate electrode being connected to a gate electrode of the first PMOS transistor, and said second NMOS transistor has a gate electrode being connected to a gate electrode of the second PMOS transistor, the gate electrode of the second NMOS transistor being electrically independent of the gate electrode of the first NMOS transistor.

20. A CMOS integrated circuit having a high level power supply line, a first low level power supply line to supply a first constant supply voltage, a second low level power supply line to supply a second constant supply voltage higher than the first constant supply voltage but lower than a voltage supplied by the high level power supply line, the circuit comprising:
   a) a first p semiconductor region connected to the first low level power supply line;
   b) a second p semiconductor region placed at a closest location to the first p semiconductor region and connected to the first low level power supply line;
   c) a first NMOS transistor formed in the first p semiconductor region and has a n+ source region connected to the first low level power supply line;
   d) a second NMOS transistor formed in the second p semiconductor region and has a n+ source region connected to the second low level power supply line;
   e) a first PMOS transistor having a p+ source region connected to the high level power supply line, a p+ drain region being connected to a n+ drain region of the first NMOS transistor; and
   f) a second PMOS transistor having a p+ source region connected to the high level power supply line, a p+ drain region being connected to a n+ drain region of the second NMOS transistor.

21. The integrated circuit of claim 20, wherein said first PMOS transistor has a gate electrode being connected to a gate electrode of the first NMOS transistor and said second PMOS transistor has a gate electrode being connected to a gate electrode of the second NMOS transistor, the gate electrode of the second PMOS transistor being electrically independent of the gate electrode of the first PMOS transistor.

22. A circuit system having a first high level power supply line to supply a first constant supply voltage, a second high level power supply line to supply a second constant supply voltage lower than the first constant supply voltage and a low level power supply line to supply a constant voltage lower than the second constant supply voltage, the system comprising:
   a) a CMOS integrated circuit formed on a chip, having:
      a first n-well connected to the first high level power supply line;
      a second n-well placed at a closest location to the first n-well and connected to the first high level power supply line:
         a first PMOS transistor formed in the first n-well and has a p+ source region connected to the first high level power supply line;
         a second PMOS transistor formed in the second n-well and has a p+ source region connected to the second high level power supply line;
         a first NMOS transistor having a n+source region connected to the low level power supply line, a n+ drain region being connected to a p+ drain region of the first PMOS transistor; and
         a second NMOS transistor having a n+ source region connected to the low level power supply line, a n+ drain region being connected to a p+ drain region of the second PMOS transistor; and
   b) a supply voltage control circuit connected to the integrated circuit, for applying the second constant supply voltage after application of the first constant supply voltage.

23. The circuit system of claim 22, wherein said first NMOS transistor has a gate electrode being connected to a gate electrode of the first PMOS transistor, and said second NMOS transistor has a gate electrode being connected to a gate electrode of the second PMOS transistor, the gate electrode of the second PMOS transistor being electrically independent of the gate electrode of the first NMOS transistor.

24. A circuit system having a first high level power supply line to supply a first constant supply voltage, a second high level power supply line to supply a second constant supply voltage lower than the first constant supply voltage, a third high level power supply line to supply a third constant supply voltage lower than the first constant supply voltage and a low level power supply line to supply a constant voltage lower than the second constant supply voltage, the circuit comprising:
   a) a CMOS integrated circuit formed on a chip, having:
      a first n-well connected to the first high level power supply line;
      a second n-well placed at a closest location to the first n-well and connected to the first high level power supply line;
      a third n-well placed at a closest location to the first or the second n-well and connected to the first high level power supply line;
      a first PMOS transistor formed in the first n-well and has a p + source region connected to the first high level power supply line;
      a second PMOS transistor formed in the second n-well and has a p+ source region connected to the second high level power supply line;
      a third PMOS transistor formed in the third n-well and has a p+ source region connected to the third high level power supply line;
      a first NMOS transistor having a n+ source region connected to the low level power supply line, a n+ drain region being connected to a p+ drain region of the first PMOS transistor;

a second NMOS transistor having a n+ source region connected to the low level power supply line, a n+ drain region being connected to a p+ drain region of the second PMOS transistor, and having a gate electrode being connected to a gate electrode of the second PMOS transistor; and a third NMOS transistor having a n+ source region connected to the low level power supply line, a n+ drain region being connected to a p+ drain region of the third PMOS transistor; and b) a supply voltage control circuit connected to the integrated circuit, for applying the second and third constant supply voltages after application of the first constant supply voltage.

25. The circuit system of claim 24, wherein said first NMOS transistor has a gate electrode being connected to a gate electrode of the first PMOS transistor, said second NMOS transistor has a gate electrode being connected to a gate electrode of the second PMOS transistor, the gate electrode of the second NMOS transistor being electrically independent of the gate electrode of the first NMOS transistor, and said third NMOS transistor has a gate electrode being connected to a gate electrode of the third PMOS transistor, the gate electrode of the third NMOS transistor being electrically independent of the gate electrode of the first and the second NMOS transistors.

26. A circuit system having a first high level power supply line to supply a first constant supply voltage, a second high level power supply line to supply a second constant supply voltage lower than the first constant supply voltage and a low level power supply line to supply a constant voltage lower than the second constant supply voltage, the system comprising:

a) a CMOS integrated circuit, having:

an n substrate connected to the first high level power supply line;

a first PMOS transistor formed in the n substrate and has a p+ source region connected to the first high level power supply line;

a second PMOS transistor formed in the n substrate adjacent to the first PMOS transistor and has a p+ source region connected to the second high level power supply line;

a first NMOS transistor having a n+ source region connected to the low level power supply line, a n+ drain region being connected to a p+ drain region of the first PMOS transistor; and a second NMOS transistor having a n+ source region connected to the low level power supply line, a n+ drain region being connected to a p+ drain region of the second PMOS transistor; and b) a supply voltage control circuit connected to the integrated circuit, for applying the second constant supply voltage after application of the first constant supply voltage.

27. The circuit system of claim 26, wherein said first NMOS transistor has a gate electrode being connected to a gate electrode of the first PMOS transistor, and said second NMOS transistor has a gate electrode being connected to a gate electrode of the second PMOS transistor, the gate electrode of the second NMOS transistor being electrically independent of the gate electrode of the first NMOS transistor.

28. An NMOS integrated circuit having a first high level power supply line to supply a first constant supply voltage, a second high level power supply line to supply a second constant supply voltage lower than the first constant supply voltage and a low level power supply line to supply a constant voltage lower than the second constant supply voltage, the circuit comprising:

a) a first p-well connected to the second high level power supply line;

b) a second p-well placed at a closest location to the first n-well and connected to the second high level power supply line;

c) a first enhancement type NMOS transistor formed in the first p-well and has a n+ source region connected to the first high level power supply line;

d) a second enhancement type NMOS transistor having a n+ source region connected to the low level power supply line, a n+ drain region being connected to a n+ drain region of the first enhancement type NMOS transistor and a gate electrode being connected to a gate electrode of the first enhancement type NMOS transistor;

e) a third enhancement type NMOS transistor formed in the second n-well and has a n+ source region connected to the second high level power supply line;

f) a fourth enhancement type NMOS transistor having a n+ source region connected to the low level power supply line, a n+ drain region being connected to a n+ drain region of the third enhancement type NMOS transistor and its gate electrode being connected to a gate electrode of the third enhancement type NMOS transistor, the gate electrode of the fourth enhancement type NMOS transistor being electrically independent of the gate electrode of the second enhancement type NMOS transistor.

29. An NMOS integrated circuit having a first high level power supply line to supply a first constant supply voltage, a second high level power supply line to supply a second constant supply voltage lower than the first constant supply voltage and a low level power supply voltage, the circuit comprising:

a) a first p-well connected to the second high level power supply line;

b) a second p-well placed at a closest location to the first n-well and connected to the second high level power supply line;

c) a first depletion type NMOS transistor formed in the first p-well and has a n+ source region connected to the first high level power supply line;

d) a first enhancement type NMOS transistor having a n+ source region connected to the low level power supply line, a n+ drain region being connected to a n+ drain region of the first depletion type NMOS transistor and a gate electrode being connected to a gate electrode of the first depletion type NMOS transistor;

e) a second depletion type NMOS transistor formed in the second n-well and has a n+ source region connected to the second high level power supply line;

f) a second enhancement type NMOS transistor having a n+ source region connected to the low level power supply line, a n+ drain region being connected to a n+ drain region of the second depletion type NMOS transistor and a gate electrode being connected to a gate electrode of the second depletion type NMOS transistor, the gate electrode of the second enhancement type NMOS transistor being electrically independent of the gate electrode of the first enhancement type NMOS transistor.

30. An integrated circuit having a plurality of regularly aligned basic cells, a first high level power supply line to supply a first constant supply voltage, a second high level power supply line to supply a second constant supply voltage lower than the first constant supply voltage and a low level power supply line to supply a constant voltage lower than the second constant supply voltage, the gate array comprising:

a) a high potential basic cell having:
    a first n-well connected to the first high level power supply line;
    a first PMOS transistor which is formed in the first n-well and has a p+ source region connected to the first high level power supply line;
    a first nMOS transistor having a n+ source region connected to the low level power supply line, a n+ drain region being connected to a p+ drain region of the first pMOS transistor;
  b) a low potential basic cell neighboring to the high potential basic cell and aligned in a row with the high potential basic cell, the low potential basic cell having:
    a second n-well connected to the first high level power supply line;
    a second pMOS transistor formed in the second n-well and has a p+ source region connected to the second high level power supply line;
    a second nMOS transistor having a n+ source region connected to the low level power supply line, a n+ drain region being connected to a p+ drain region of the second pMOS transistor.

31. The integrated circuit of claim 30, wherein said first nMOS transistor has a gate electrode being connected to a gate electrode of the first pMOS transistor, and said second nMOS transistor has a gate electrode being connected to a gate electrode of the second pMOS transistor, the gate electrode of the second nMOS transistor being electrically independent of the gate electrode of the first nMOS transistor.

* * * * *